(12) United States Patent
Zhang

(10) Patent No.: US 10,566,388 B2
(45) Date of Patent: Feb. 18, 2020

(54) THREE-DIMENSIONAL VERTICAL MEMORY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvalis, OR (US)

( * ) Notice: Subject to any disclaimer, the term of this patent is extended or adjusted under 35 U.S.C. 154(b) by 0 days.

(21) Appl. No.: 16/137,512

(22) Filed: Sep. 20, 2018

(65) Prior Publication Data

US 2019/0363132 A1   Nov. 28, 2019

(30) Foreign Application Priority Data

| May 27, 2018 | (CN) | 2018 1 0518263 |
| May 30, 2018 | (CN) | 2018 1 0537891 |
| May 30, 2018 | (CN) | 2018 1 0542880 |
| Jun. 14, 2018 | (CN) | 2018 1 0619764 |
| Jun. 26, 2018 | (CN) | 2018 1 0674263 |

(51) Int. Cl.
| *H01L 27/24* | (2006.01) |
| *H01L 23/528* | (2006.01) |
| *H01L 27/112* | (2006.01) |
| *H01L 27/22* | (2006.01) |
| *H01L 23/525* | (2006.01) |
| *H01L 45/00* | (2006.01) |
| *H01L 43/02* | (2006.01) |
| *H01L 43/12* | (2006.01) |

(52) U.S. Cl.
CPC .......... *H01L 27/249* (2013.01); *H01L 23/528* (2013.01); *H01L 23/5252* (2013.01); *H01L 27/11206* (2013.01); *H01L 27/224* (2013.01); *H01L 27/2409* (2013.01); *H01L 43/02* (2013.01); *H01L 43/12* (2013.01); *H01L 45/1226* (2013.01); *H01L 45/1253* (2013.01); *H01L 45/16* (2013.01)

(58) Field of Classification Search
CPC ............... H01L 27/249; H01L 27/2409; H01L 45/1253; H01L 45/1226
See application file for complete search history.

(56) References Cited

U.S. PATENT DOCUMENTS

| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |

(Continued)

*Primary Examiner* — Allison Bernstein

(57) ABSTRACT

In a shared three-dimensional vertical memory (3D-$M_V$), each horizontal address line comprises at least two regions: a lightly-doped region and a low-resistivity region. The lightly-doped region is formed around selected memory holes and shared by a plurality of low-leakage memory cells. The low-resistivity region forms a conductive network to reduce the resistance of the horizontal address line.

20 Claims, 20 Drawing Sheets

(56) References Cited

U.S. PATENT DOCUMENTS

| | | |
|---|---|---|
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 7,800,091 B2 * | 9/2010 | Kamigaichi .......... H01L 27/249 257/3 |

\* cited by examiner

Substrate Circuit 0K

THREE-DIMENSIONAL VERTICAL MEMORY

CROSS-REFERENCE TO RELATED APPLICATIONS

This application claims priorities from Chinese Patent Application 201810518263.X, filed on May 27, 2018; Chinese Patent Application 201810537891.2, filed on May 30, 2018; Chinese Patent Application 201810542880.3, filed on May 30, 2018; Chinese Patent Application 201810619764.7, filed on Jun. 14, 2018; Chinese Patent Application 201810674263.9, filed on Jun. 26, 2018, in the State Intellectual Property Office of the People's Republic of China (CN), the disclosure of which are incorporated herein by references in its entireties.

BACKGROUND

1. Technical Field of the Invention

The present invention relates to the field of integrated circuit, and more particularly to three-dimensional memory.

2. Prior Art

Three-dimensional vertical memory (3D-$M_V$) is a monolithic semiconductor memory. It comprises a plurality of vertical memory strings disposed side-by-side above (or, on) a semiconductor substrate. Each memory string comprises a plurality of vertically stacked memory cells. Because its memory cells are formed in a three-dimensional (3-D) space, the 3D-$M_V$ has a large storage density and a low storage cost.

FIGS. 1A-1B disclose the overall structure of a conventional 3D-$M_V$ (prior art). FIG. 1A is its cross-sectional view. It comprises a substrate circuit 0K, horizontal address lines 8a-8h, memory holes 2a-2d, programmable layers 6a-6d, vertical address lines 4a-4d and memory cells 1aa-1ha . . . . The substrate circuit 0K is formed on a semiconductor substrate 0. The horizontal address lines 8a-8h are interleaved with insulating layers 5a-5g above the substrate circuit 0K. The memory holes 2a-2d penetrate through the horizontal address lines 8a-8h and the insulating layers 5a-5g. The programmable layers 6a-6d cover the sidewalls of the memory holes 2a-2d. The vertical address lines 4a-4d is formed in the remaining spaces of the memory holes 2a-2d. The memory cells 1aa-1ha . . . are formed at the intersections of the horizontal address lines 8a-8h and the vertical address lines 4a-4d. Among them, all memory cells 1aa-1ha coupled to a same vertical address line 4a form a memory string 1A.

FIG. 1B is a top view of a horizontal address line 8a (prior art). The horizontal address line (also known as horizontal conductive plate) 8a is a horizontal conductive plate with finite dimensions. After penetrating through the horizontal address line 8a, the memory holes 2a-2h have their sidewalls covered by the programmable layer 6a-6h, before being filled with conductive materials to form the vertical address lines (also known as vertical conductive lines) 4a-4h. As before, the memory cells 1aa-1ah are formed at the intersections of the horizontal address line 8a and the vertical address lines 4a-4h.

FIG. 1C is a symbol of the memory cell 1. The memory cell 1 comprises a programmable layer 12 and a diode 14. The resistance of the programmable layer 12 can be changed by at least an electrical programming signal. The diode 14 has two terminals: a positive terminal (also known as anode) 1+ and a negative terminal (also known as cathode) 1−. In general, a diode 14 favors current flow from its anode 1+ to its cathode 1−, but not the opposite. Technically, a diode is any two-terminal device with the following characteristics: when the applied voltage has its magnitude smaller than the read voltage $V_R$ or its polarity opposite to the read voltage $V_R$, the electrical resistance of the diode 14 is substantially larger than the read resistance $V_R$ (i.e. the electrical resistance when the applied voltage is equal to the read voltage $V_R$). In other patents or technical papers, the diode 14 in a 3D-$M_V$ is also referred to as selector, steering element, quasi-conductive layer, or other names. In this specification, these names have the same meaning.

The diode 14 is preferably a built-in P-N junction diode or Schottky diode formed naturally between the horizontal address line 8a and the vertical address line 4a. A built-in diode means that no separate diode layer is needed. To reduce the reverse leakage current and improve the reverse breakdown voltage of the diode 14, both the P-N junction diode and the Schottky diode preferably comprise a lightly-doped region. For example, the P-N junction diode preferably has a P+/N−/N+ structure, the Schottky diode preferably has a metal/N−/N+ structure. In both diode structures, the lightly-doped region is an N− layer and has a thickness ranging from tens of nanometers to tens of microns. Throughout this specification, the lightly-doped region could comprise an N− semiconductor material, an intrinsic (i−) semiconductor material, a P− semiconductor material, or a combination thereof.

FIG. 1D is a circuit schematic of a memory array 10a (prior art). It comprises word lines 8a-8h, bit lines 4a-4h and memory cells 1aa-1ah . . . . Within a memory array 10a, all word lines 8a-8h and all bit lines 4a-4h are continuous; and, they are not shared with any adjacent memory array(s). In this example, the word lines 8a-8h are coupled with the anodes 1+ of the diodes 14 in the memory cells 1aa-1ah, while the bit lines 4a-4h are coupled with the cathodes 1− of the diodes in the memory cells 1aa-1ah. During read, a read voltage $V_R$ is applied to a selected one of the word lines, and the information stored in a memory cell(s) is read out from an associated bit line(s). Note that all unprogrammed memory cells 1aa-1ah . . . in a conventional semiconductor memory have similar physical structures. When the programmed memory cells store the same digital information (i.e. in the same digital state), they have similar electrical (e.g. current-voltage) characteristics.

FIG. 1E shows the structure of a memory cell 1aa whose memory hole 2a comprises a lightly-doped region 4a' (prior art). The anode 1+ of the diode 14 is the horizontal address line 8a, while its cathode 1− is the vertical address line 4a. The anode 1+ comprises at least a P+ semiconductor material (for the P-N junction diode) or at least a metallic material (for the Schottky diode), while the cathode 1− comprises at least a N− layer 4a' and N+ layer 4a. Because both N− and N+ layers 4a', 4a are formed inside the memory hole 2a, the diameter D of the memory hole 2a is equal to the sum of the diameter d of the vertical address line 4a, twice the thickness T of the N− layer 4a' and twice the thickness t of the programmable layer 6a (i.e. D=d+2T+2t). As the thickness T of the N− layer 4a' ranges from tens of nanometers to tens of microns, the diameter D of the memory hole 2a is large. This leads to a low storage density and a high storage cost.

OBJECTS AND ADVANTAGES

It is a principle object of the present invention to provide a 3D-$M_V$ with a large storage capacity.

It is a further object of the present invention to provide a 3D-$M_V$ with a low storage cost.

It is a further object of the present invention to provide a 3D-$M_V$ with smaller memory holes.

It is a further object of the present invention to provide a 3D-$M_V$ with denser memory holes.

In accordance with these and other objects of the present invention, the present invention discloses several improved three-dimensional vertical memories (3D-$M_V$).

SUMMARY OF THE INVENTION

To minimize the diameter of the memory hole, the present invention discloses a two-region 3D-$M_V$. Different from prior art of FIG. 1E, the lightly-doped region of the diode in the preferred two-region 3D-$M_V$ is disposed outside the memory hole. Because the memory hole comprises only the vertical address line and the programmable layer, its diameter D is smaller. To be more specific, the horizontal address line of the preferred two-region 3D-$M_V$ comprises at least two regions: a first region and a second region. The first region is a lightly-doped region surrounding the memory hole. It comprises at least a lightly-doped semiconductor material which would reduce the reverse leakage current and improve the reverse breakdown voltage of the memory cells. The second region is a low-resistivity region outside the first region. It comprises at least a conductive material whose resistivity is lower than that of the lightly-doped region. The low-resistivity region lowers the resistance of the horizontal address line and shortens the access time of the 3D-$M_V$.

To reduce the spacing between the memory holes, the present invention further discloses a shared 3D-$M_V$. It is an improvement over the two-region 3D-$M_V$ with each lightly-doped region shared by a plurality of memory cells. To be more specific, the horizontal address line of the preferred shared 3D-$M_V$ comprises at least two regions: a first lightly-doped region and a second low-resistivity region. Each lightly-doped region comprises a plurality of memory cells, which are formed at the intersections of the lightly-doped region and the vertical address lines. Because the memory cells in the lightly-doped region have a small reverse leakage current, these memory cells are referred to as low-leakage memory cells. On the other hand, the conductive material in the low-resistivity region forms a conductive network in the horizontal address line. It provides a low-resistance current-flowing path. This ensures a short access time and a small programming voltage.

Relative to the low-leakage memory cells in the lightly-doped region, the memory cells formed at the intersections of the low-resistivity region and the vertical address lines have a larger reverse leakage current and therefore, are referred to as high-leakage memory cells. Although a memory array of the preferred shared 3D-$M_V$ could include both low-leakage and high-leakage memory cells at the same time, as long as the total number of the high-leakage memory cells is far smaller than that of the low-leakage memory cells, the performance of the preferred shared 3D-$M_V$ would not be compromised.

The present invention discloses several preferred embodiments of the shared 3D-$M_V$'s. In the first preferred embodiment, the memory cells are formed in both lightly-doped and low-resistivity regions and have the same areal density (i.e. the number of memory cells per unit area on the horizontal address line). As long as the total area of the lightly-doped region is much larger than that of the low-resistivity region, this preferred embodiment can function correctly. In this preferred embodiment, the lightly-doped region has a rectangular shape. The second preferred embodiment is similar to the first preferred embodiment except that the lightly-doped region has a hexagonal shape. It should be apparent to those skilled in the art that the lightly-doped region could take other geometric shapes.

In the third preferred embodiment, the areal density of the high-leakage memory cells is smaller than that of the low-leakage memory cell. This would improve the performance of the 3D-$M_V$. In the fourth preferred embodiment, no memory holes penetrate through the low-resistivity region. Because only the lightly-doped region comprises memory cells while the low-resistivity region does not comprise any memory cells, the memory array comprises only low-leakage memory cells, but no high-leakage memory cells. This would further improve the performance of the 3D-$M_V$.

There is a major difference between the preferred shared 3D-$M_V$ and a conventional semiconductor memory. In the conventional semiconductor memory, all unprogrammed memory cells (e.g. state '0') have similar physical structures, while the programmed memory cells storing the same digital information (i.e. in the same digital state, e.g. state '1') have similar electrical characteristics. In the preferred shared 3D-$M_V$, even if they store the same digital information, the low-leakage memory cell and high-leakage memory cell have different electrical characteristics: the resistance of the high-leakage memory cell (e.g. state '1') is smaller than that of the low-leakage memory cell (e.g. state '1'); and, the resistance of the low-leakage memory cell (e.g. state '1') is smaller than that of the unprogrammed memory cell (e.g. state '0').

Accordingly, the present invention discloses a three-dimensional vertical memory (3D-$M_V$), comprising: a semiconductor substrate including a substrate circuit; a plurality of horizontal address lines above said substrate circuit; a plurality of memory holes penetrating through said horizontal address lines; a plurality of programmable layers covering the sidewalls of said memory holes; a plurality of vertical address lines formed in said memory holes; wherein each of said horizontal address lines comprises at least first and second regions, with said first region having a higher resistivity than said second region.

The present invention further discloses another three-dimensional vertical memory (3D-$M_V$), comprising: a semiconductor substrate including a substrate circuit; a plurality of horizontal address lines above said substrate circuit; a plurality of memory holes penetrating through said horizontal address lines; a plurality of programmable layers covering the sidewalls of said memory holes; a plurality of vertical address lines formed in said memory holes; wherein each of said horizontal address lines comprises at least a first region surrounding selected ones of said vertical address lines, said first region comprising at least a lightly-doped semiconductor material.

The present invention further discloses a semiconductor memory, comprising: a plurality of first-state memory cells including at least a first-state memory cell; a plurality of second-state memory cells including at least a low-leakage memory cell and at least a high-leakage memory cell; an address line coupling said first-state memory cell, said low-leakage memory cell and said high-leakage memory cell; wherein said high-leakage memory cell has a smaller resistance than said low-leakage memory cell; and, said low-leakage memory cell has a smaller resistance than said first-state memory cell.

BRIEF DESCRIPTION OF THE DRAWINGS

FIG. 3AB is a symbol representing the memory cell of FIG. 3AA; FIG. 3BB is a symbol representing the memory cell of FIG. 3BA.

FIG. 5B is an x-y top view of its horizontal address line 8a; FIG. 5CB is a circuit schematic of a memory array of the first preferred shared 3D-$M_V$ which uses the memory cell of FIGS. 3BA-3BB.

FIG. 7B is an x-y top view of its horizontal address line 8a; FIG. 7CB is a circuit schematic of a memory array of the second preferred shared 3D-$M_V$ which uses the memory cell of FIGS. 3BA-3BB.

Figure 1A:
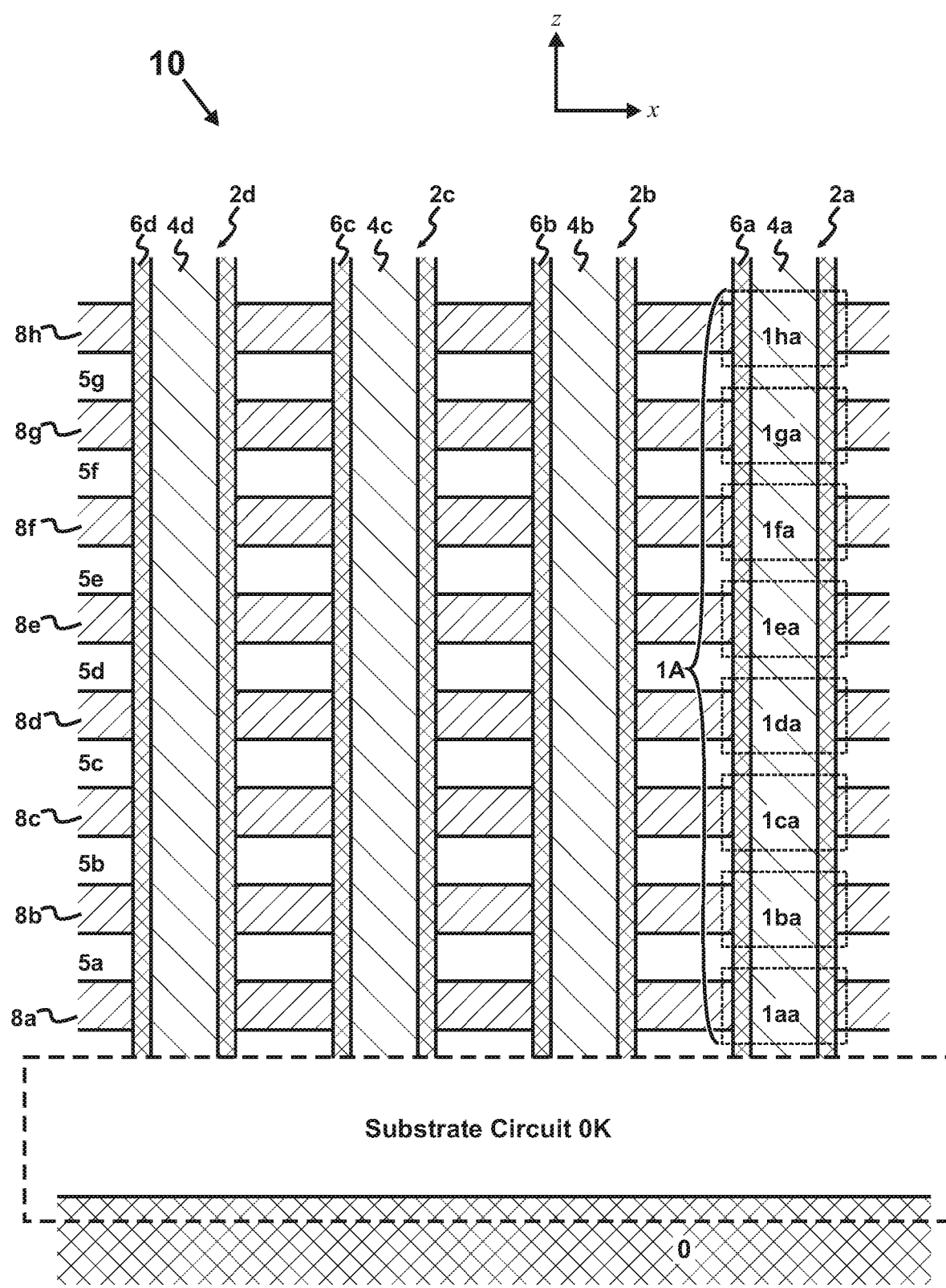
FIG. 1A is a z-x cross-sectional view of a conventional 3D-$M_V$ along the cutline A-A' of FIG. 1B (prior art)
Figure 1B:
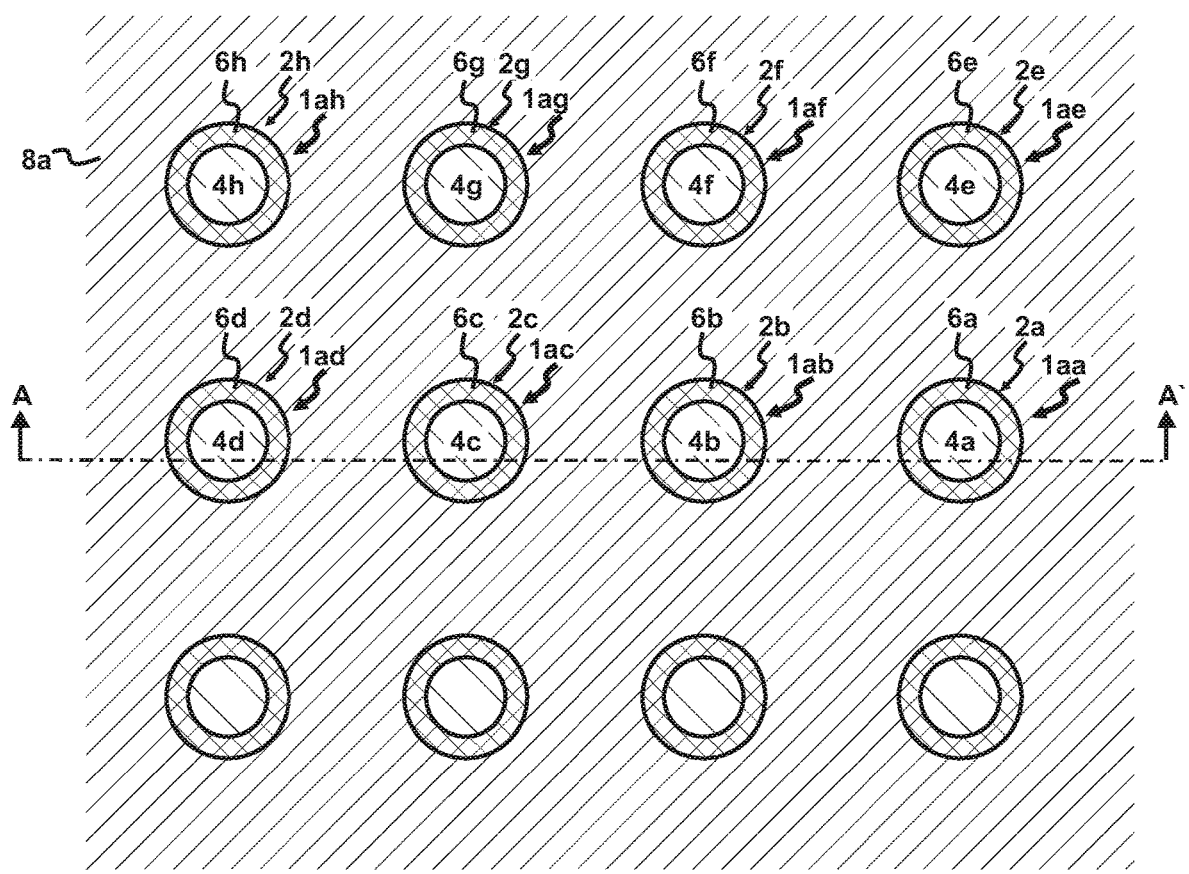
FIG. 1B is an x-y top view of its horizontal address line 8a (prior art)
Figure 1C:
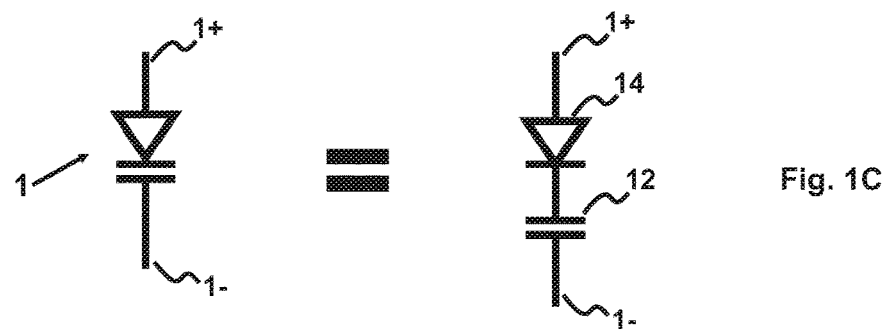
FIG. 1C is a symbol representing a memory cell.
Figure 1D:
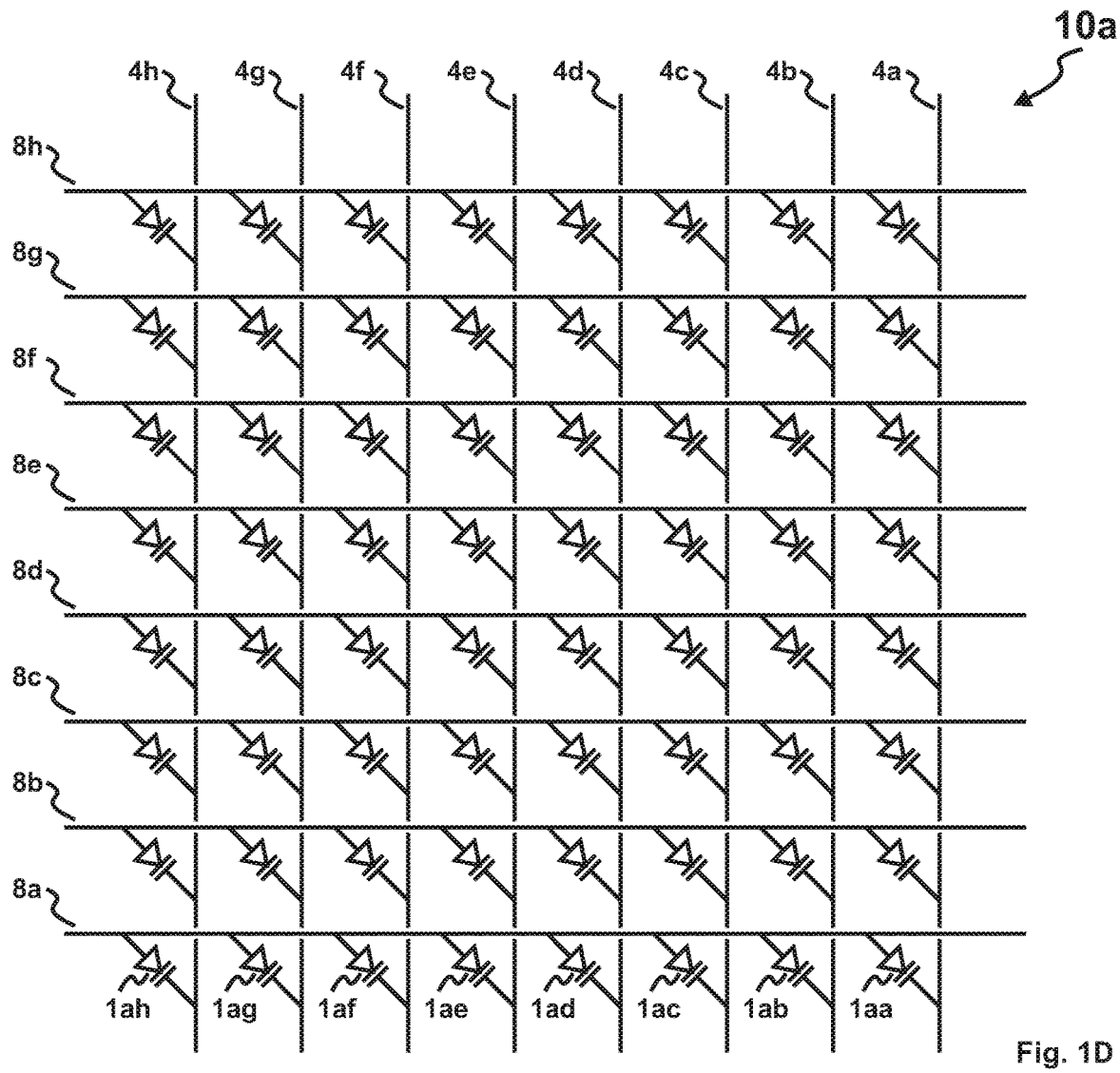
FIG. 1D is a circuit schematic of a memory array of the conventional 3D-$M_V$ (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

Throughout the present invention, the phrase "on the substrate" means the active elements of a circuit are formed on the surface of the substrate, although the interconnects between these active elements are formed above the substrate; the phrase "above the substrate" means the active elements are formed above the substrate and do not touch the substrate. The symbol "/" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1E:
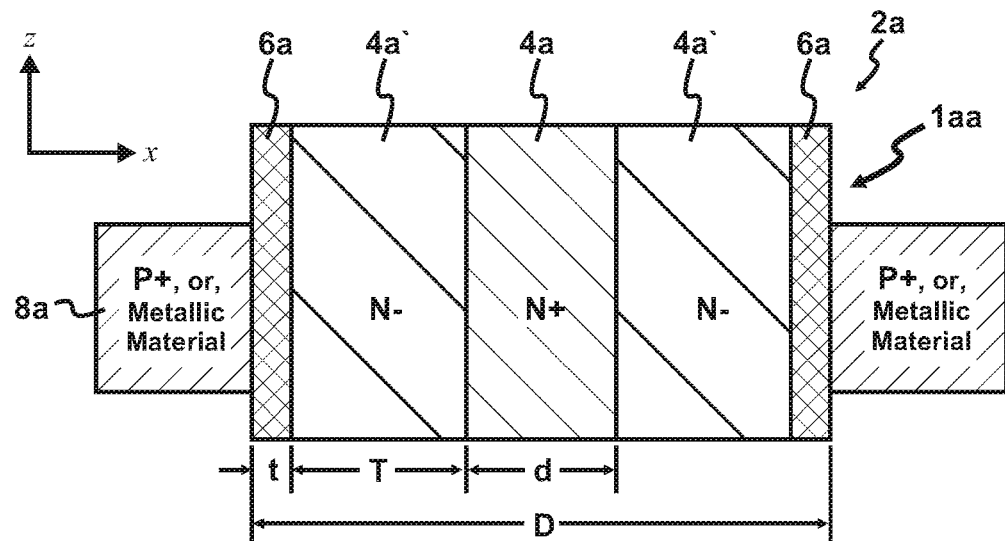
FIG. 1E is a z-x cross-sectional view of a memory cell whose memory hole comprises a lightly-doped region (prior art).

To minimize the diameter of the memory hole, the present invention discloses a two-region 3D-$M_V$. Different from prior art of FIG. 1E, the lightly-doped region of the diode in the preferred two-region 3D-$M_V$ is disposed outside the memory hole. Because the memory hole comprises only the vertical address line and the programmable layer, its diameter D is smaller. Details of the preferred two-region 3D-$M_V$'s are disclosed in FIGS. 2-4B.

Figure 2:
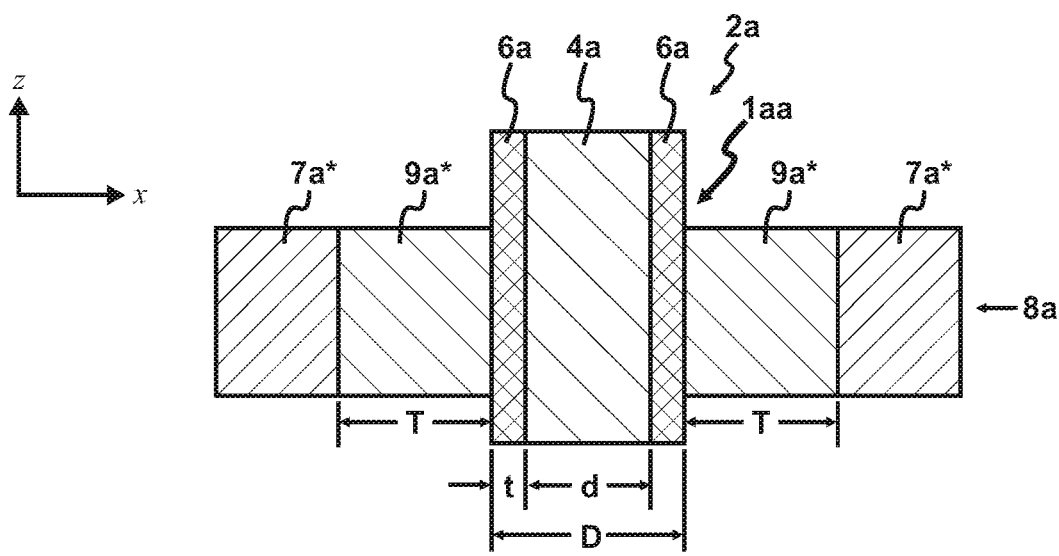
FIG. 2 is a z-x cross-sectional view of a preferred two-region 3D-$M_V$ memory cell.

Referring now to FIG. 2, a memory cell 1aa of a preferred two-region 3D-$M_V$ is shown. It comprises a horizontal address line 8a, a memory hole 2a penetrating through the horizontal address line 8a, a programmable layer 6a covering the sidewall of the memory hole 2a, and a vertical address line 4a in the memory hole 2a. The programmable layer 6a could be one-time programmable (OTP), multiple-time programmable (MTP) or re-programmable. For an OTP memory, the programmable layer 6a comprises an antifuse layer. Examples of the antifuse material include silicon oxide layer, silicon nitride layer, or a combination thereof. For an MTP or re-programmable memory, the programmable layer 6a is a re-writable layer. Examples of the re-writable material include resistive RAM (RRAM) material, phase-change memory (PCM) material, conductive-bridge RAM (CBRAM) material, magnetic RAM (MRAM) material and other materials. The thickness t of the programmable layer 6a ranges from 1 nm to 200 nm.

The horizontal address line 8a comprises two regions: a first region 9a* and a second region 7a*. The first region 9a* is a lightly-doped region surrounding the memory hole 2a. It comprises at least a lightly-doped semiconductor material, e.g. N− semiconductor material, P− semiconductor material, or intrinsic semiconductor material. The thickness T of the lightly-doped region 9a* ranges from tens of nanometers to tens of microns. The second region 7a* is a low-resistivity region outside the lightly-doped region 9a*. It comprises at least a conductive material whose resistivity is lower than that of the lightly-doped region 9a*. Examples of the conductive material include heavily-doped semiconductor material (e.g. N+ semiconductor material, P+ semiconductor material, semiconductor material doped with metal, etc.), and metallic material (e.g. metal, metal compound, etc.). The presence of the lightly-doped region 9a* reduces the reverse leakage current and improves the reverse breakdown voltage of the memory cell 1aa, whereas the presence of the low-resistivity region 7a* lowers the resistance of the horizontal address line 8a and shortens the access time of the 3D-$M_V$.

Because the lightly-doped region 9a* in the memory cell 1aa is disposed outside the memory hole 2a, the diameter D of the memory hole 2a is equal to the sum of the diameter d of the vertical address line 4a and twice the thickness t of the programmable layer 6a (i.e. D=d+2t). As a result, the diameter D of the memory hole 2a is much smaller than that of FIG. 1E (prior art).

Figure 3A:
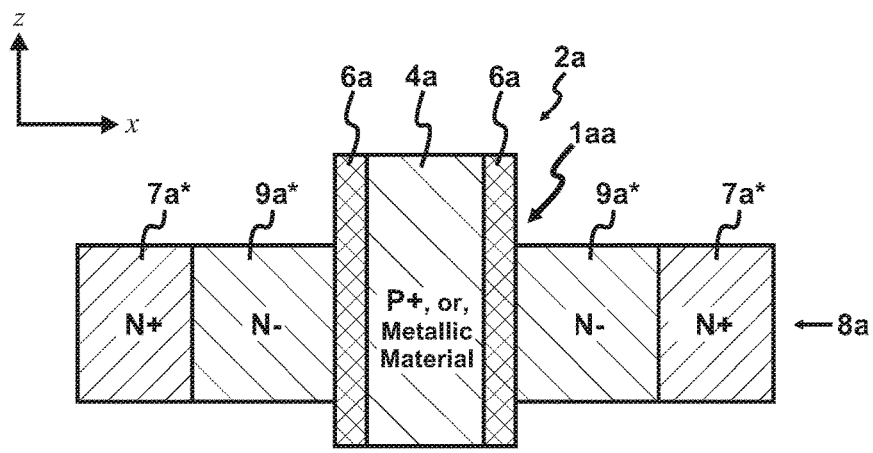
FIG. 3AA is a z-x cross-sectional view of a first preferred embodiment of the two-region 3D-$M_V$ memory cell.
Figure 3A:
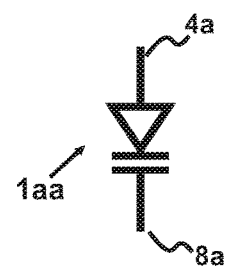

FIGS. 3AA-3AB disclose a first preferred embodiment of the two-region 3D-$M_V$ memory cell 1aa. In this first preferred embodiment, the vertical address line 4a comprises P+ semiconductor material or metallic material, while the lightly-doped region 9a* of the horizontal address line 8a comprises at least an N− (or, i−) semiconductor material and the low-resistivity region 7a* comprises at least an N+ semiconductor material (FIG. 3AA). Accordingly, the vertical address line 4a is coupled to the anode of the diode 14, whereas the horizontal address line 8a is coupled to the cathode of the diode 14 (FIG. 3AB).

Figure 3B:
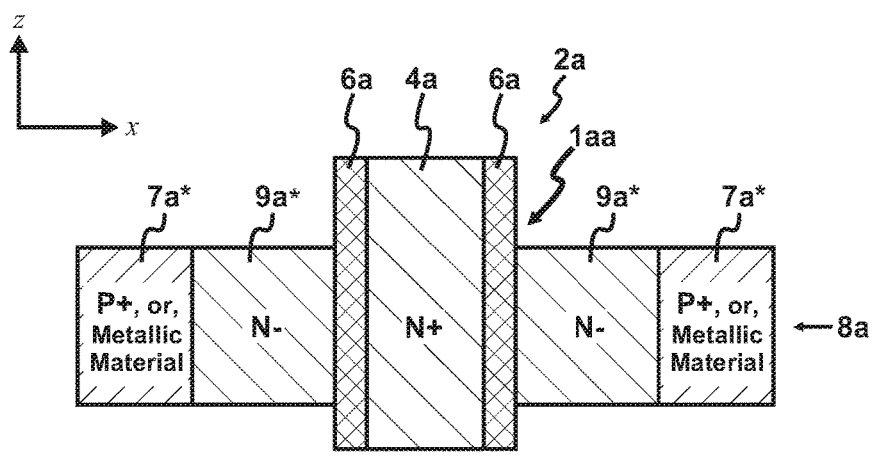
FIG. 3BA is a z-x cross-sectional view of a second preferred embodiment of the two-region 3D-$M_V$ memory cell.
Figure 3B:
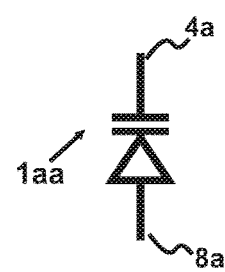

FIGS. 3BA-3BB disclose a second preferred embodiment of the two-region 3D-$M_V$ memory cell 1aa. In this second preferred embodiment, the vertical address line 4a comprises at least an N+ semiconductor material, while the lightly-doped region 9a* of the horizontal address line 8a comprises at least an N− (or, i−) semiconductor material and the low-resistivity region 7a* comprises at least a P+ semiconductor material or metallic material (FIG. 3BA). Accordingly, the vertical address line 4a is coupled to the cathode of the diode 14, whereas the horizontal address line 8a is coupled to the anode of the diode 14 (FIG. 3BB).

Figure 4A:
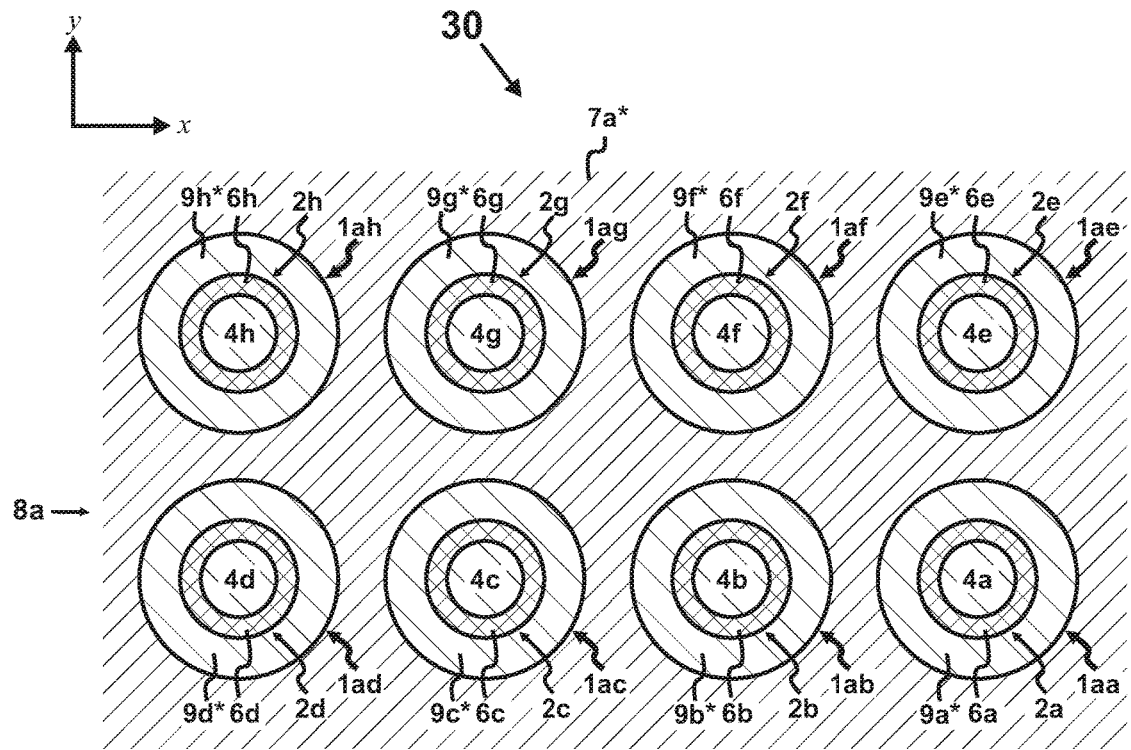
FIG. 4A is an x-y top view of a horizontal address line 8a of the preferred two-region 3D-$M_V$.
Figure 4B:
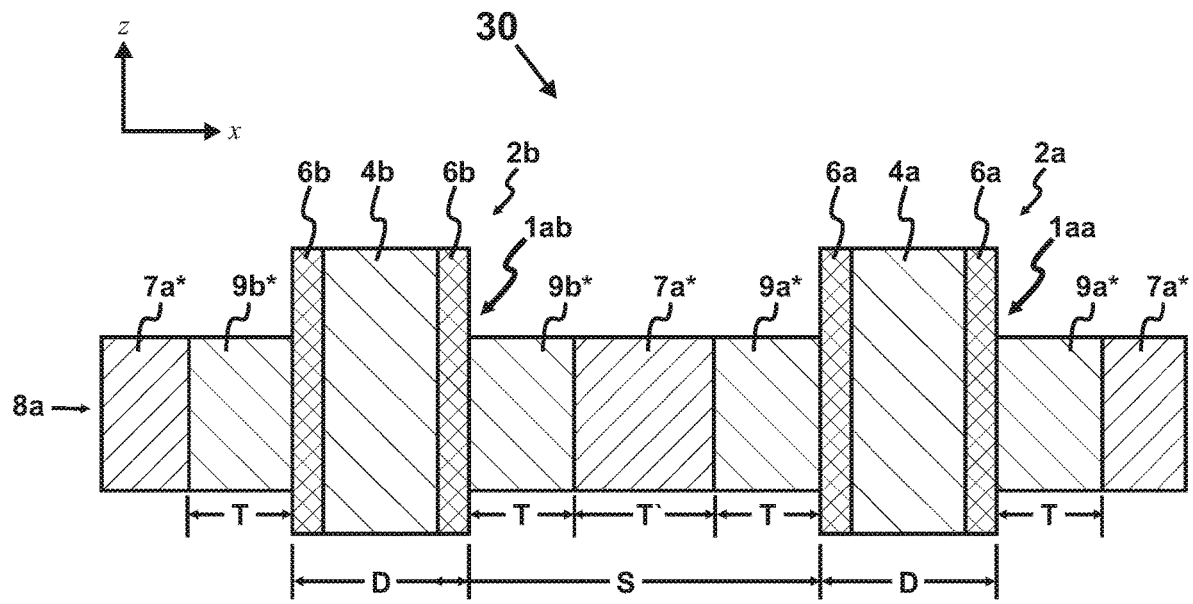
FIG. 4B is a z-x cross-sectional view of two neighboring memory cells of the preferred two-region 3D-$M_V$.

FIGS. 4A-4B disclose an overall structure of a preferred two-region 3D-$M_V$ 30. FIG. 4A is a top view of a horizontal address line 8a. The memory holes 2a-2h penetrate through the horizontal address line 8a. Inside the memory holes 2a-2h, their sidewalls are covered with the programmable layers 6a-6h. Outside the memory holes 2a-2h, the lightly-doped regions 9a*-9h* surround the memory holes 2a-2h. Further outside the lightly-doped regions 9a*-9h*, the remaining areas of the horizontal address line 8a are the low-resistivity region 7a*.

FIG. 4B shows two neighboring memory cells 1aa, 1ab in the preferred two-region 3D-$M_V$ 30. Each of the memory cells 1aa, 1ab has the structure shown in FIG. 2. Between the two memory cells 1aa, 1ab, there is a low-resistivity region 7a*. The spacing S between two memory holes 2a, 2b is equal to the sum of twice the thickness T of the lightly-doped regions 9a*, 9b* and the thickness T' of the low-resistivity region 7a* (i.e. S=2T+T'). Because the thickness T of the lightly-doped regions 9a*, 9b* ranges from tens of nanometers to tens of microns, the spacing S in this preferred two-region 3D-$M_V$ 30 is large.

To reduce the spacing between the memory holes, the present invention further discloses a shared 3D-$M_V$. It is an improvement over the two-region 3D-$M_V$ with each lightly-doped region shared by a plurality of memory cells. In the following figures, FIGS. 5A-6D disclose a first preferred shared 3D-$M_V$, FIGS. 7A-7CB disclose a second preferred shared 3D-$M_V$, and FIGS. 8A-8D disclose several other preferred embodiments.

Figure 5A:
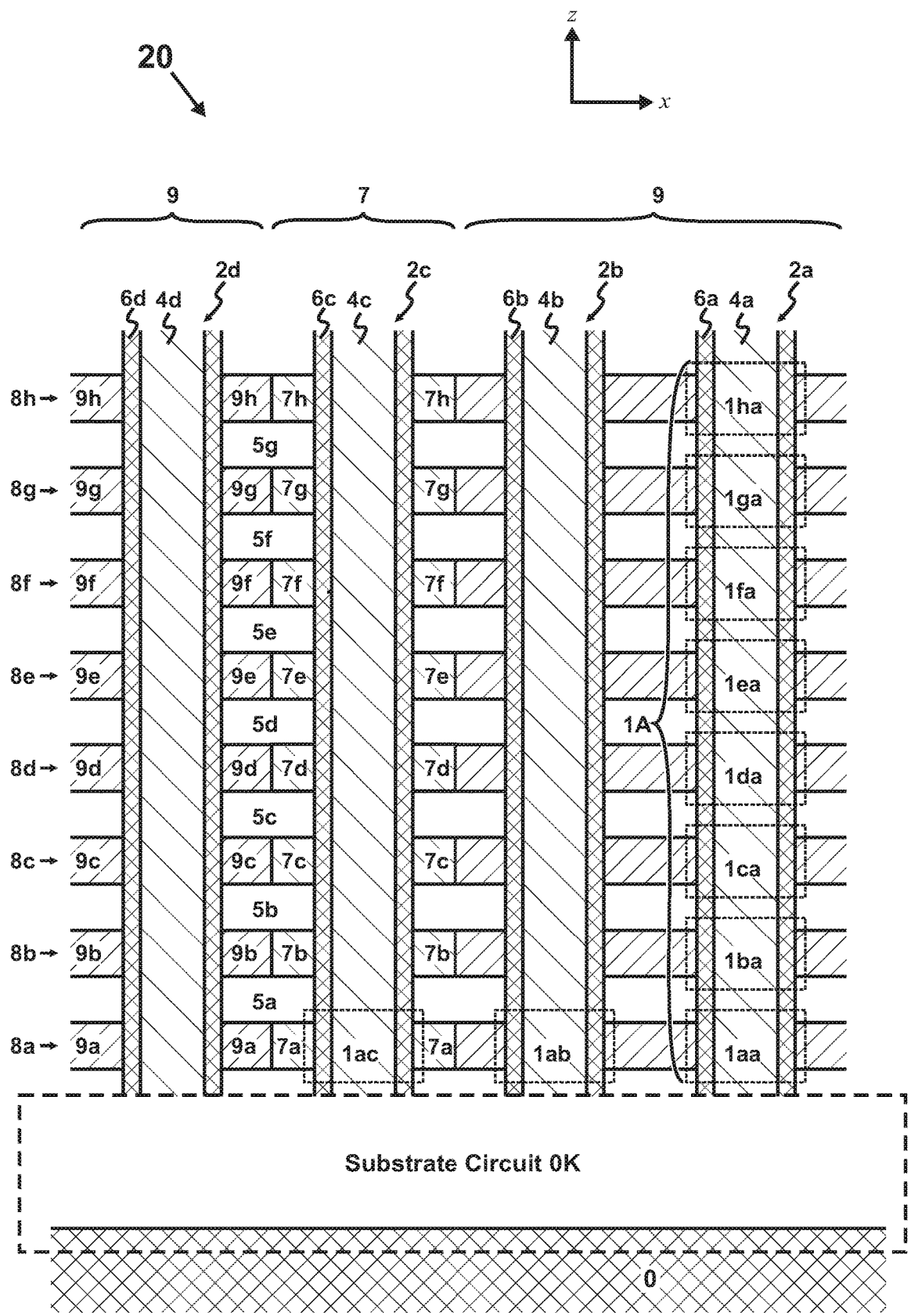
FIG. 5A is a z-x cross-sectional view of a first preferred shared 3D-$M_V$ along the cutline B-B' of FIG. 5B.
Figure 5B:
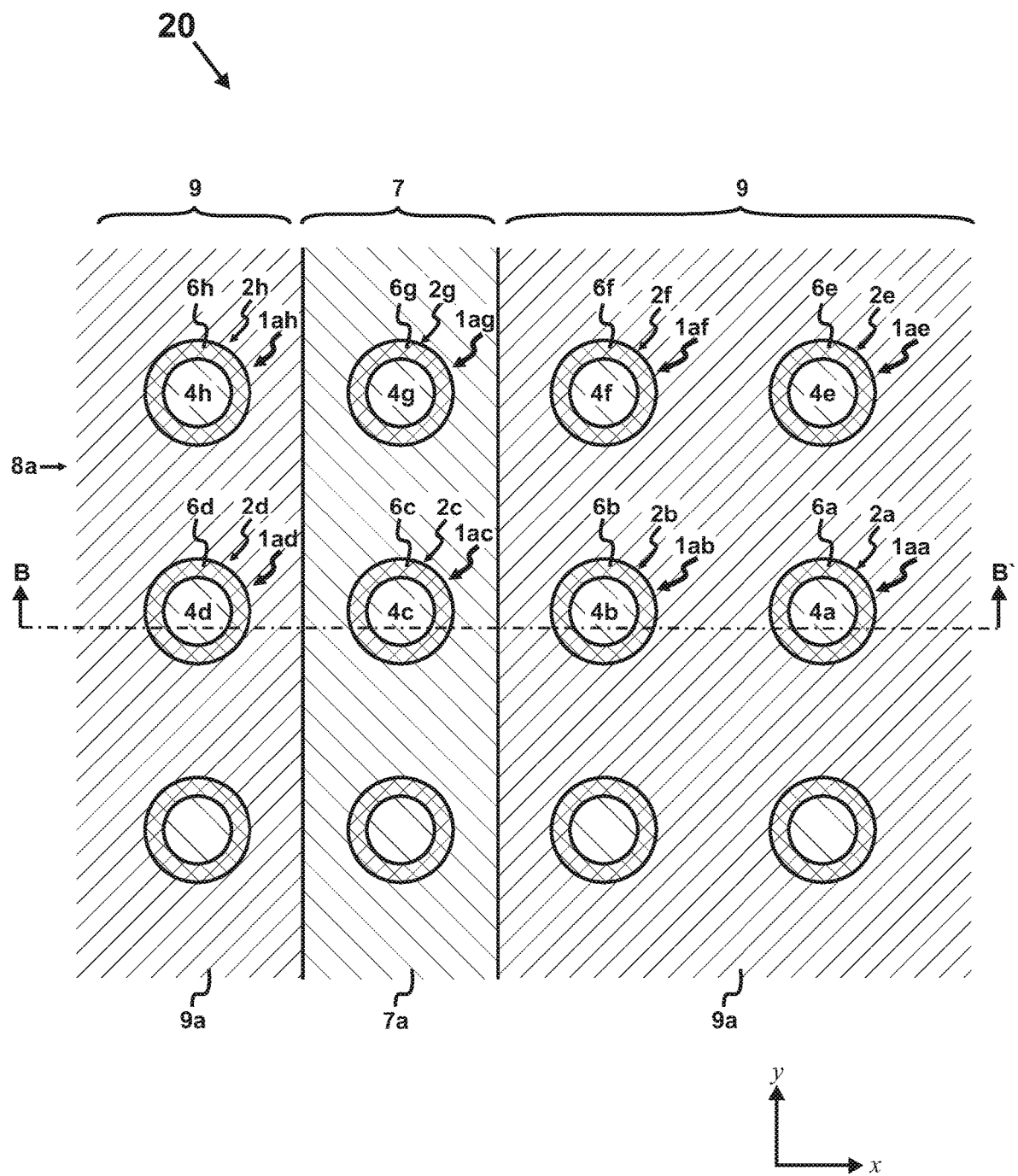
Figure 5C:
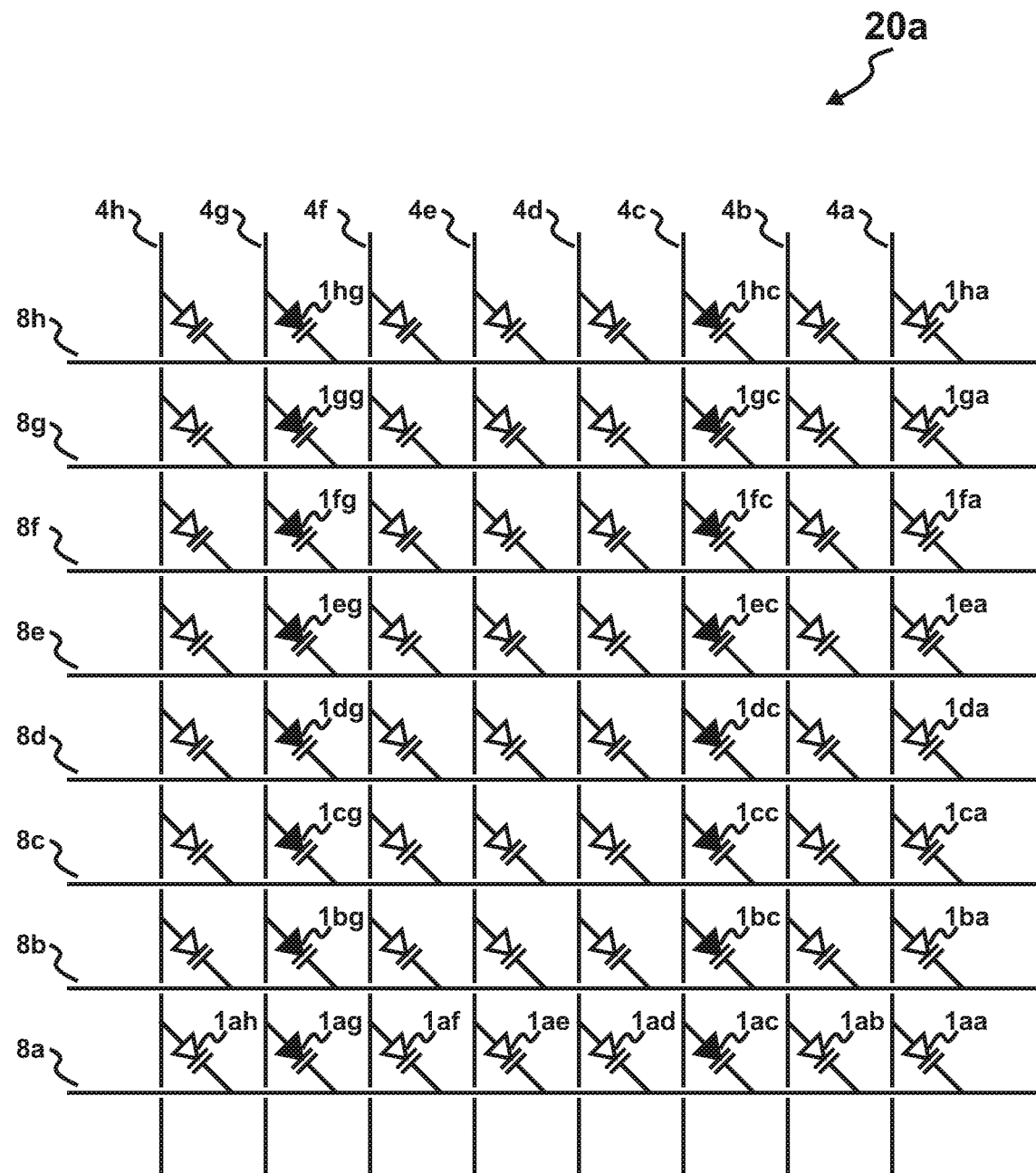
FIG. 5CA is a circuit schematic of a memory array of the first preferred shared 3D-$M_V$ which uses the memory cell of FIGS. 3AA-3AB.
Figure 5C:
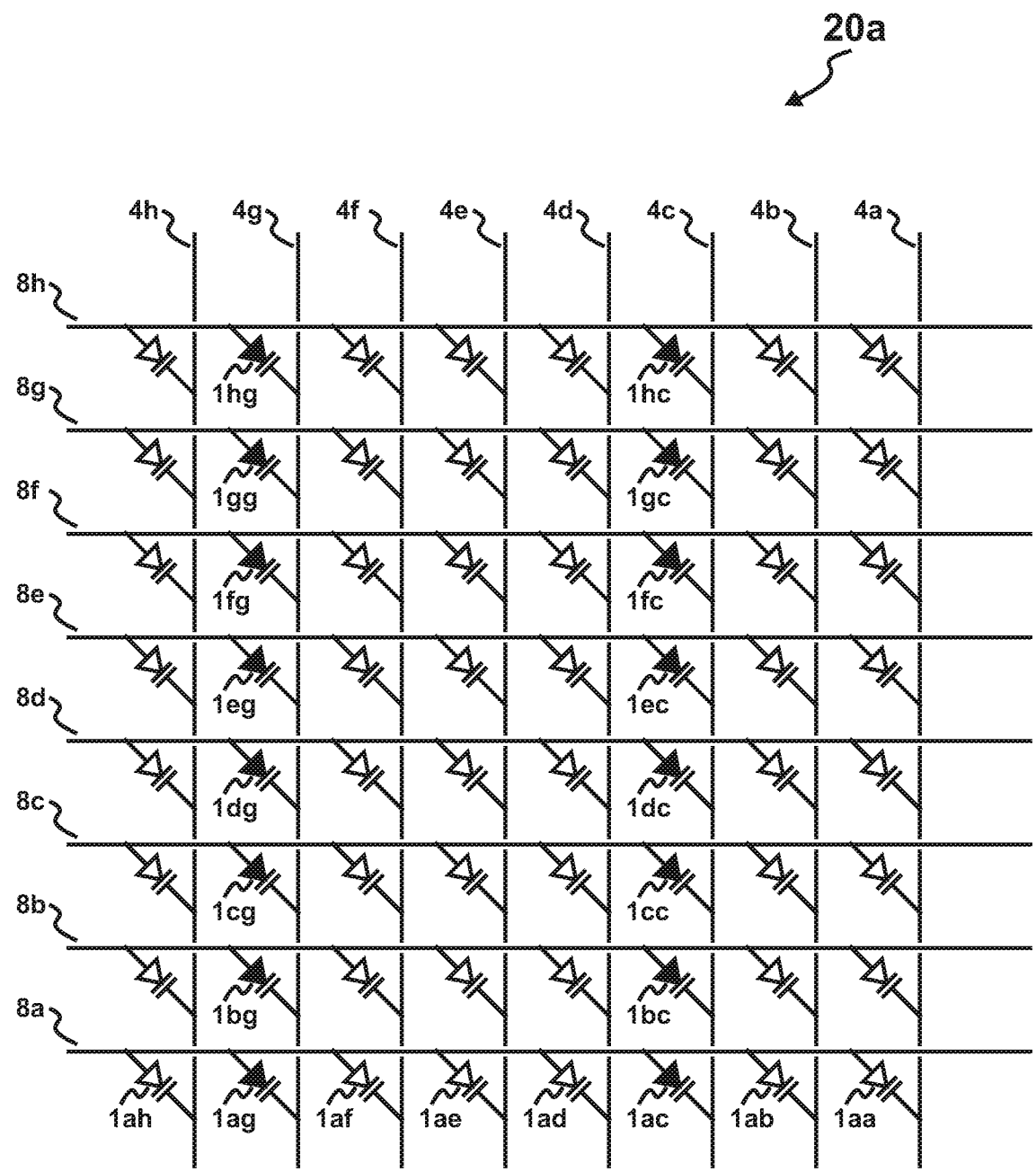

Referring now to FIGS. 5A-5CB, a first preferred shared 3D-$M_V$ 20 is shown. It comprises a plurality of vertically stacked horizontal address lines 8a-8h, a plurality of memory holes 2a-2d penetrating through the horizontal address lines 8a-8h, a plurality of programmable layers 6a-6d covering the sidewalls of the memory holes 2a-2d, and a plurality of vertical address lines 4a-4d formed inside the memory holes 2a-2d (FIG. 5A). The preferred shared 3D-$M_V$ 20 is divided into at least two sections: a first lightly-doped section 9 and a second low-resistivity section 7. All horizontal address lines 8a-8h that fall within the first lightly-doped section 9 comprises at least a lightly-doped semiconductor material, while all horizontal address lines 8a-8h that fall within the second low-resistivity section 7 comprises at least a low-resistivity material. Accordingly, the horizontal address lines 8a-8h comprise at least two regions: first lightly-doped regions 9a-9h and second low-resistivity regions 7a-7h.

For each horizontal address line (e.g. 8a), its lightly-doped region 9a is shared by the memory cells 1aa, 1ab, 1ae, 1af (FIG. 5B). Because they are formed at the intersections of the lightly-doped region 9a and the vertical address lines 4a, 4b, 4e, 4f, these memory cells 1aa, 1ab, 1ae, 1af have small reverse leakage currents and therefore, are referred to as low-leakage memory cells. Whereas, the memory cells 1ac, 1ag formed at the intersections of the low-resistivity region 7a and vertical address lines 4c, 4g have large reverse leakage currents and therefore, are referred to as high-leakage memory cells. On the other hand, the conductive material in the low-resistivity region 7a forms a conductive network in the horizontal address line 8a. It provides a low-resistance current-flowing path. This ensures a short access time and a small programming voltage for the preferred shared 3D-$M_V$ 20.

FIG. 5CA is a circuit schematic of a memory array 20a of the first preferred shared 3D-$M_V$ 20 which uses the memory cell of FIGS. 3AA-3AB. Each open symbol (i.e. with an open triangle) represents a low-leakage memory cell (e.g. 1aa), while each solid symbol (i.e. with a solid triangle) represents a high-leakage memory cell (e.g. 1ac). As indicated in FIG. 3AB, the vertical address lines 4a-4h are coupled to the anodes of the diodes in the memory cells 1aa-1ah . . . and act as word lines, whereas the horizontal address lines 8a-8h are coupled to the cathodes of the diodes in the memory cells 1aa-1ah . . . and act as bit lines. During read, a read voltage $V_R$ is applied on a selected one (e.g. 4a) of the vertical address lines (word lines) 4a-4h while all other vertical address lines 4b-4h are grounded. The information stored in the memory cells 1aa-1ha is read out by sensing the voltage changes on the horizontal address lines (bit lines) 8a-8h. In this preferred embodiment, the horizontal address lines (bit lines) 8a-8h are coupled to the sense amplifiers (not shown in this figure for reason of simplicity).

FIG. 5CB is a circuit schematic of a memory array 20a of the first preferred shared 3D-$M_V$ 20 which uses the memory cell of FIGS. 3BA-3BB. As indicated in FIG. 3BB, the vertical address lines 4a-4h are coupled to the cathodes of the diodes in the memory cells 1aa-1ah . . . and act as bit lines, whereas the horizontal address lines 8a-8h are coupled to the anodes of the diodes and act as word lines. During read, a read voltage $V_R$ is applied on a selected one (e.g. 8a) of the horizontal address lines (word lines) 8a-8h while all other horizontal address lines 8b-8h are grounded. The information stored in the memory cells 1aa-1ah is read out by sensing the voltage changes on the vertical address lines (bit lines) 4a-4h. In this preferred embodiment, the vertical address lines (bit lines) 4a-4h are coupled to the sense amplifiers (not shown in this figure for reason of simplicity).

In the conventional semiconductor memory, all unprogrammed memory cells (e.g. in state '0') have similar physical structures, while the programmed memory cells storing the same digital information (i.e. in the same digital state, e.g. in state '1') have similar electrical characteristics. On the other hand, in the preferred shared 3D-$M_V$ 20, even if they store the same digital information, the low-leakage memory cell 1aa and high-leakage memory cell 1ac have different electrical characteristics: the resistance of the high-leakage memory cell (e.g. in state '1') 1ac is lower than that of the low-leakage memory cell (e.g. in state '1') 1aa; and, the resistance of the low-leakage memory cell (e.g. in state '1') is smaller than that of the unprogrammed memory cell (e.g. in state '0').

Figure 6A:
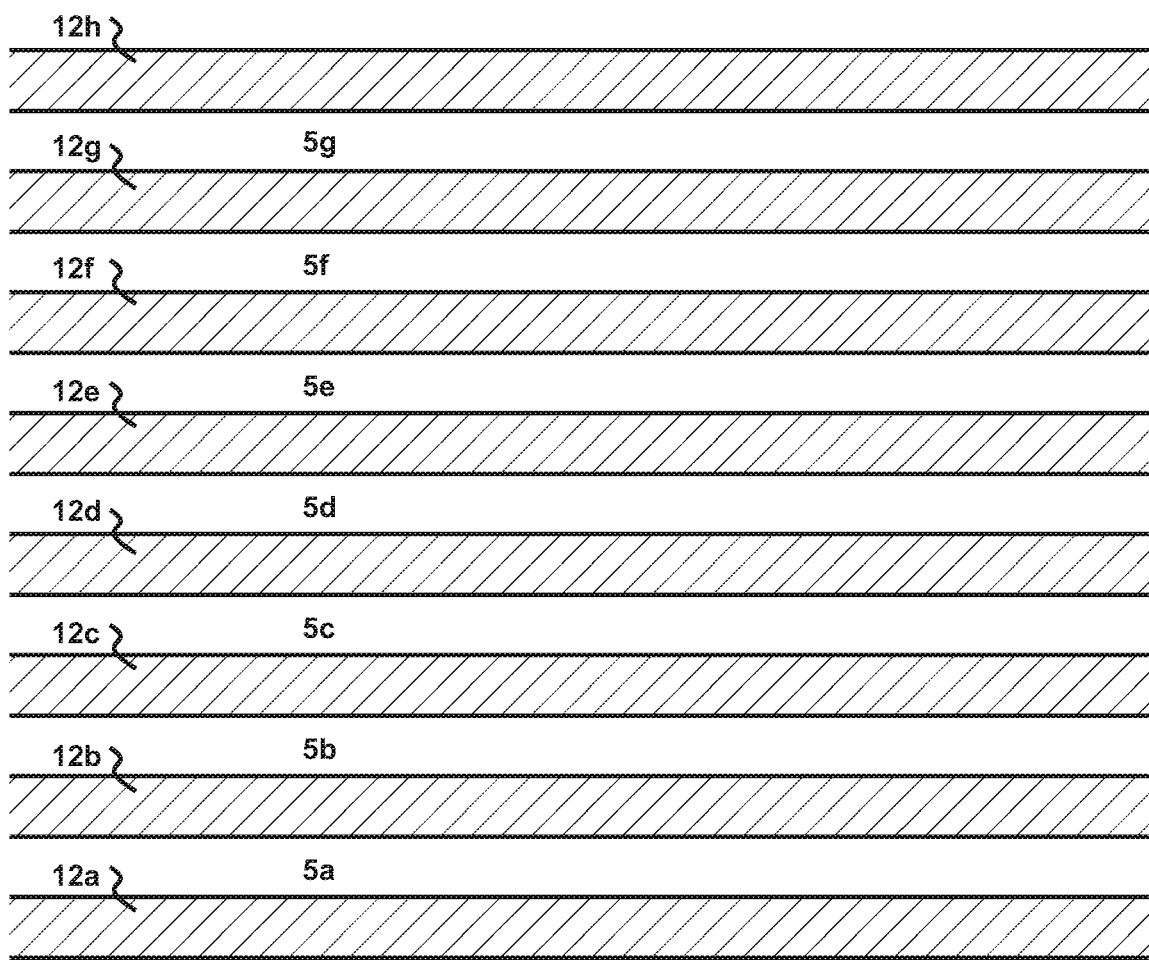
FIGS. 6A-6D are z-x cross-sectional views of the first preferred shared 3D-$M_V$ at four manufacturing steps.

FIGS. 6A-6D show four manufacturing steps of the first preferred shared 3D-$M_V$ 20. The manufacturing steps for the substrate circuit 0K is well known to those skilled in the art and will not be described here. After the top of the substrate circuit 0K is planarized, a first lightly-doped layer 12a is deposited thereon. This lightly-doped layer 12a has a thickness ranging from 5 nm to 200 nm. It could be doped with N− semiconductor material, P− semiconductor material, or not doped at all (i.e. an intrinsic semiconductor layer). Then a first insulating layer 5a is deposited on the lightly-doped layer 12a. The insulating layer 5a has a thickness ranging from 5 nm to 200 nm. It could comprise silicon oxide, silicon nitride, other insulating material, or a combination thereof. This process is then repeated for the remaining lightly-doped layers 12b-12h and insulating layers 5b-5g (FIG. 6A).

Figure 6B:
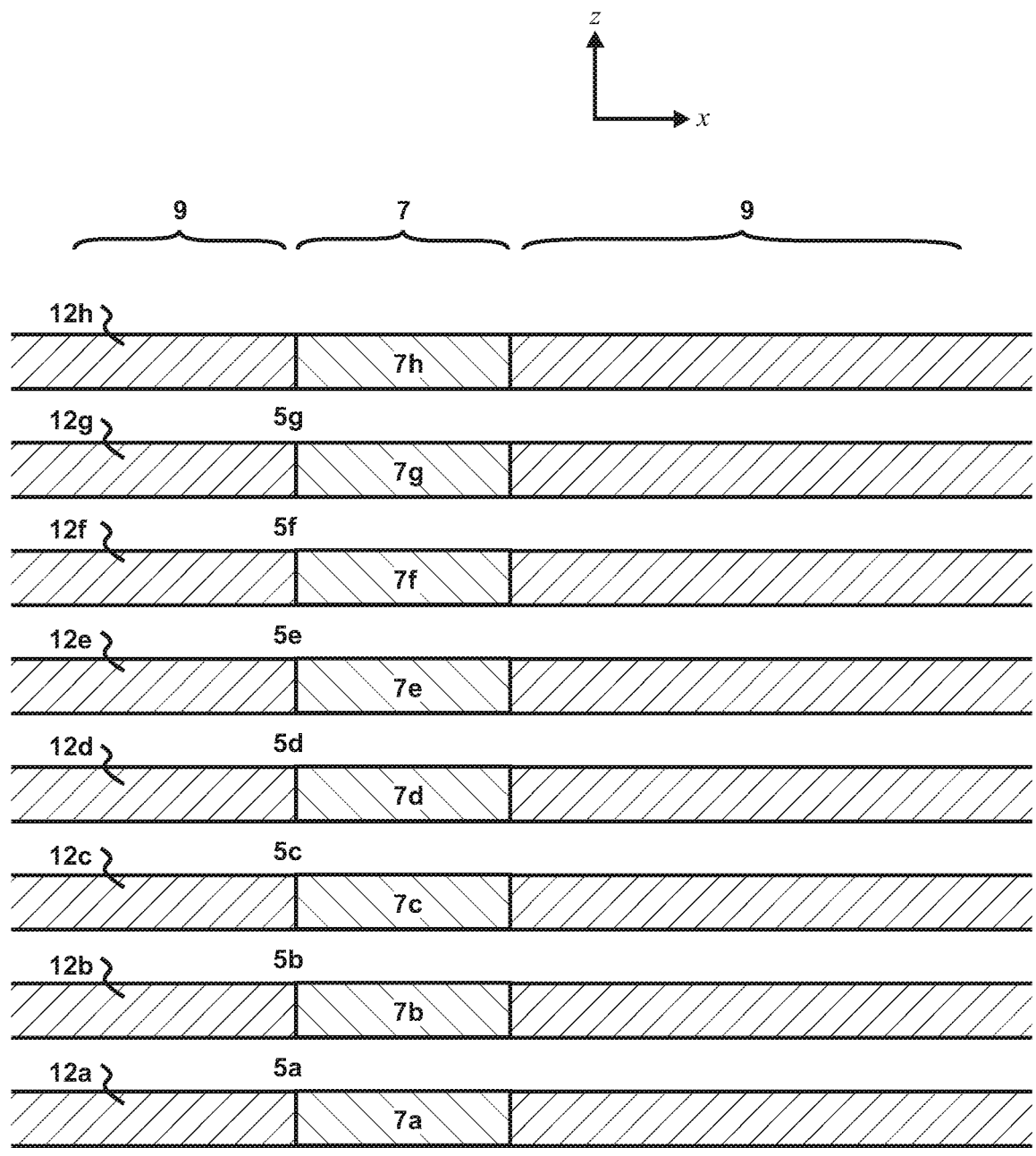
Figure 6B:
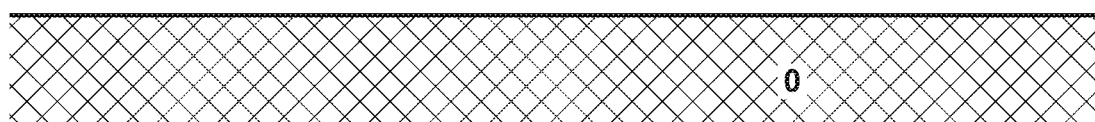

After forming the lightly-doped layers 12a-12h, a first photolithography step is performed on its top surface. A photo-resist layer (not shown in FIG. 6B for reason of simplicity) covers the low-resistivity section 9 but not the lightly-doped section 7. Then an ion-implant step is carried out. The implanted ions could be N+ ions, P+ ions, or metal ions. After the ion-implant step, the regions 7a-7h in the lightly-doped layers 12a-12h become heavily doped and have a low resistivity (FIG. 6B).

Figure 6C:
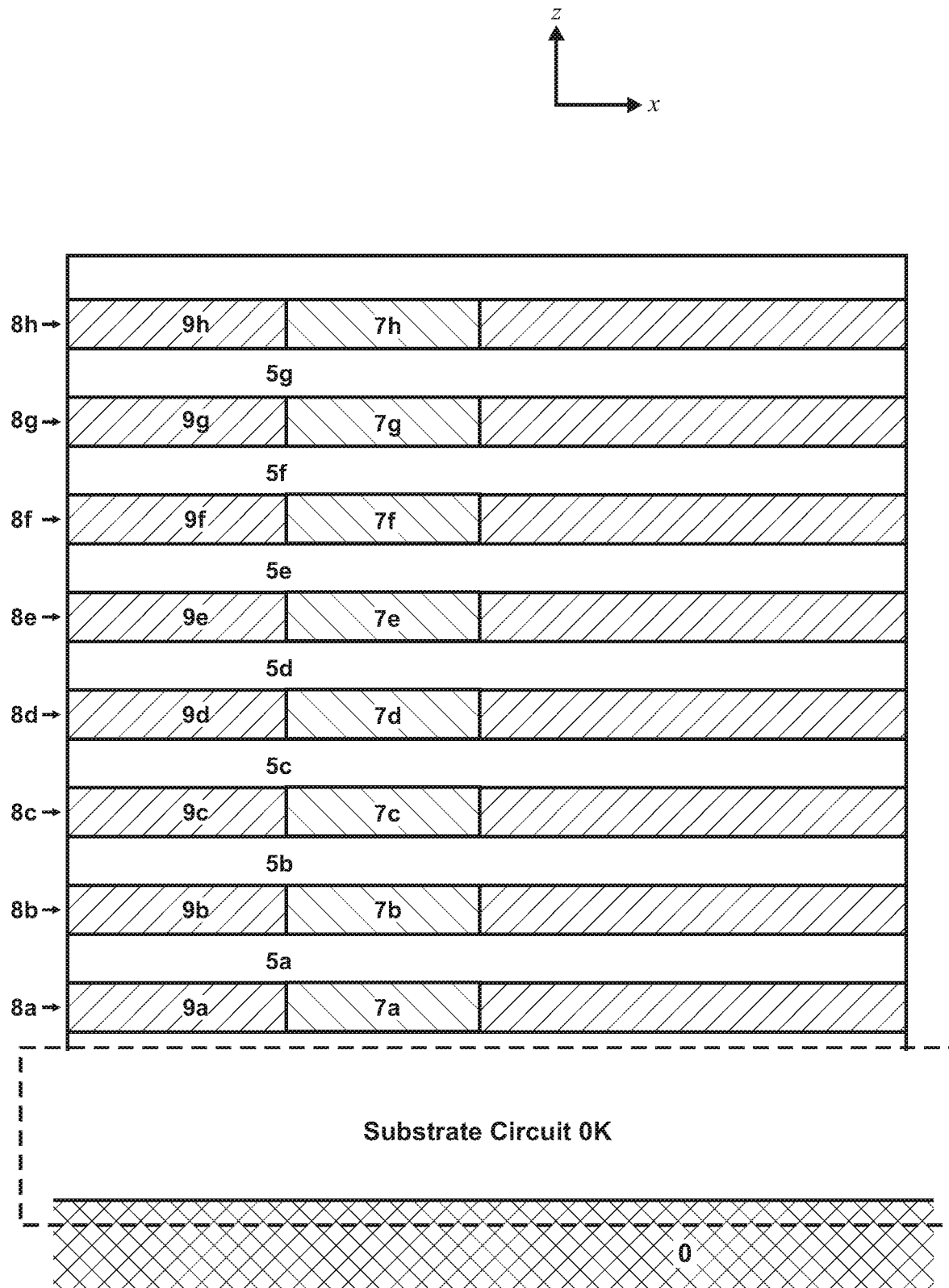
Figure 6D:
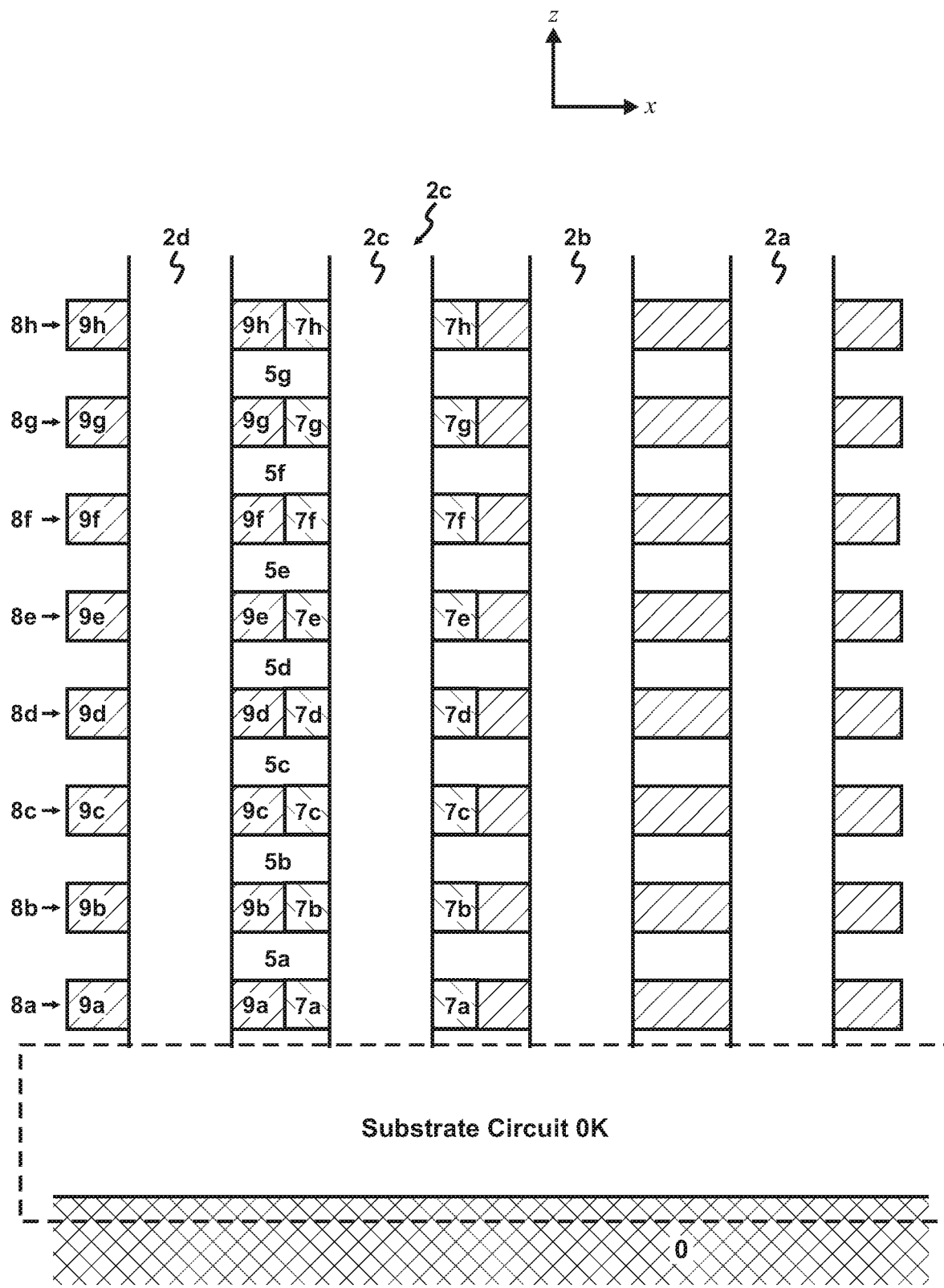

Next, a second photolithography step is performed. The lightly-doped layers 12a-12h are etched to form the horizontal address lines 8a-8h and associated structures (FIG. 6C). Then a third photolithography step is performed. The memory holes 2a-2d are etched through the horizontal address lines 8a-8h (FIG. 6D). This is followed by the formation of the programmable layers 6a-6d and the vertical address lines 4a-4d (FIG. 5A). Since the above manufacturing steps are similar to those of 3D-NAND, their details will not be described here. Overall, the preferred shared 3D-$M_V$ 20 has a simple physical structure and requires a simple manufacturing process.

In one preferred manufacturing method, the lightly-doped layers 12a-12h and insulating layers 5a-5g are preferably deposited continuously and without any interruption (FIG. 6A). These layers are deposited inside a single deposition tool without any non-depositing steps (e.g. photolithography steps) in-between. As a result, wafers do not need to be taken out from the deposition tool during the deposition process. Because planarization is well kept during these deposition steps, tens to hundreds of lightly-doped layers can be deposited together (eight layers are shown in FIG. 6A). In other words, the preferred shared 3D-$M_V$ 20 could comprise tens to hundreds of levels of horizontal address lines. For this preferred method, the low-resistivity regions 7a-7h in the horizontal address lines 8a-8h are formed in a single ion-implant step.

In another preferred manufacturing method, the low-resistivity regions 7a-7h are formed in separate steps (not shown in FIGS. 6A-6D for reason of simplicity). For example, a lithography step is performed after the formation of the first lightly-doped layer 12a. Then an ion-implant step (or, a silicidation step) is carried out to lower the resistivity of a selected region 7a in the first lightly-doped layer 12a. This is followed by the formation of the first insulating layer 5a and the second lightly-doped layer 12b. After that, another lithography step is performed and another ion-implant step (or, another silicidation step) is carried out to lower the resistivity of another selected region 7b in the second lightly-doped layer 12b. The above steps are repeated for other lightly-doped layers 12c-12h. One advantage of this method is that the low-resistivity regions (e.g. 7a, 7b) can be formed at different locations in different lightly-doped layers (e.g. 12a, 12b). They do not need to overlap.

Figure 7A:
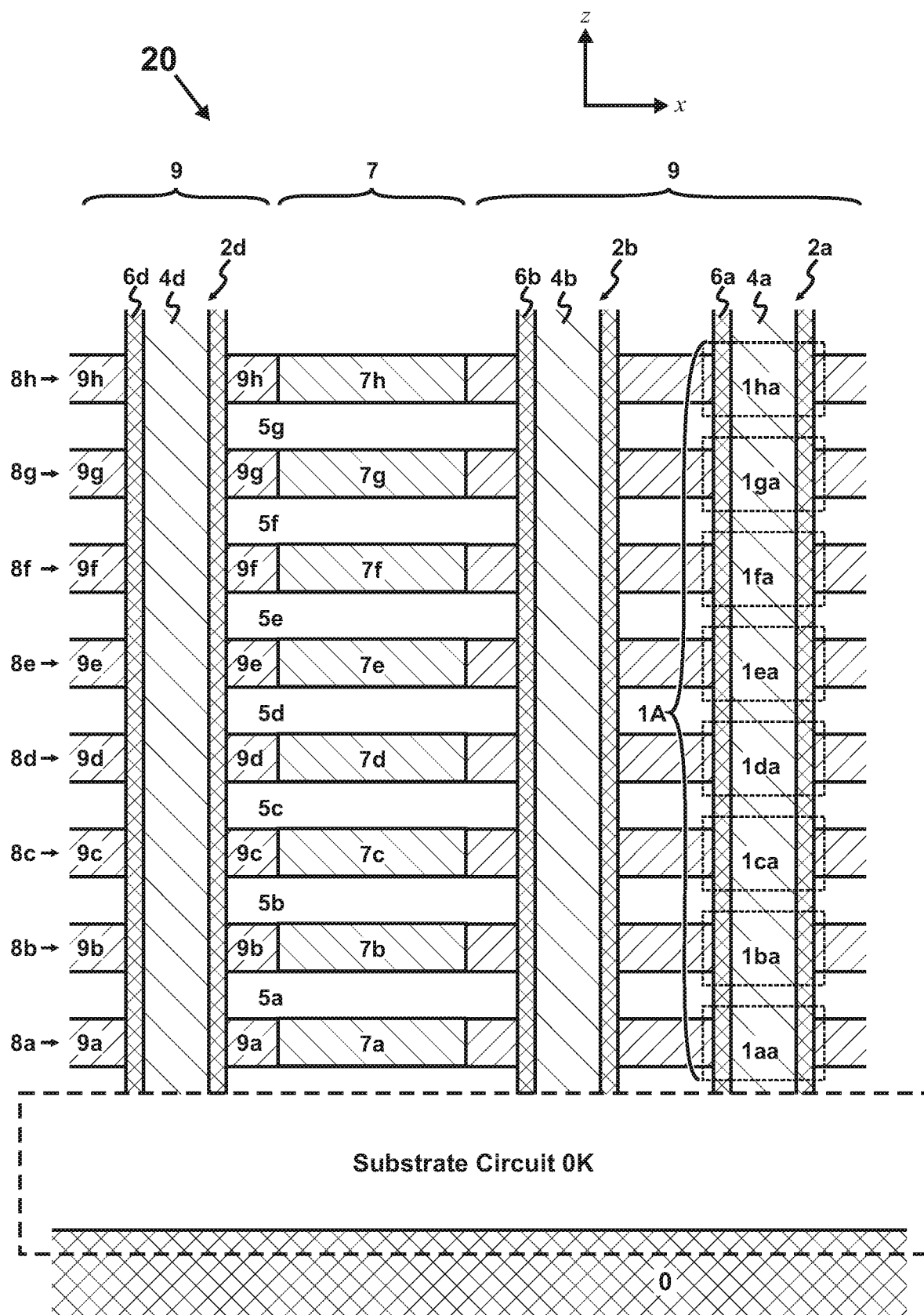
FIG. 7A is a z-x cross-sectional view of a second preferred shared 3D-$M_V$ along the cutline C-C of FIG. 7B.
Figure 7B:
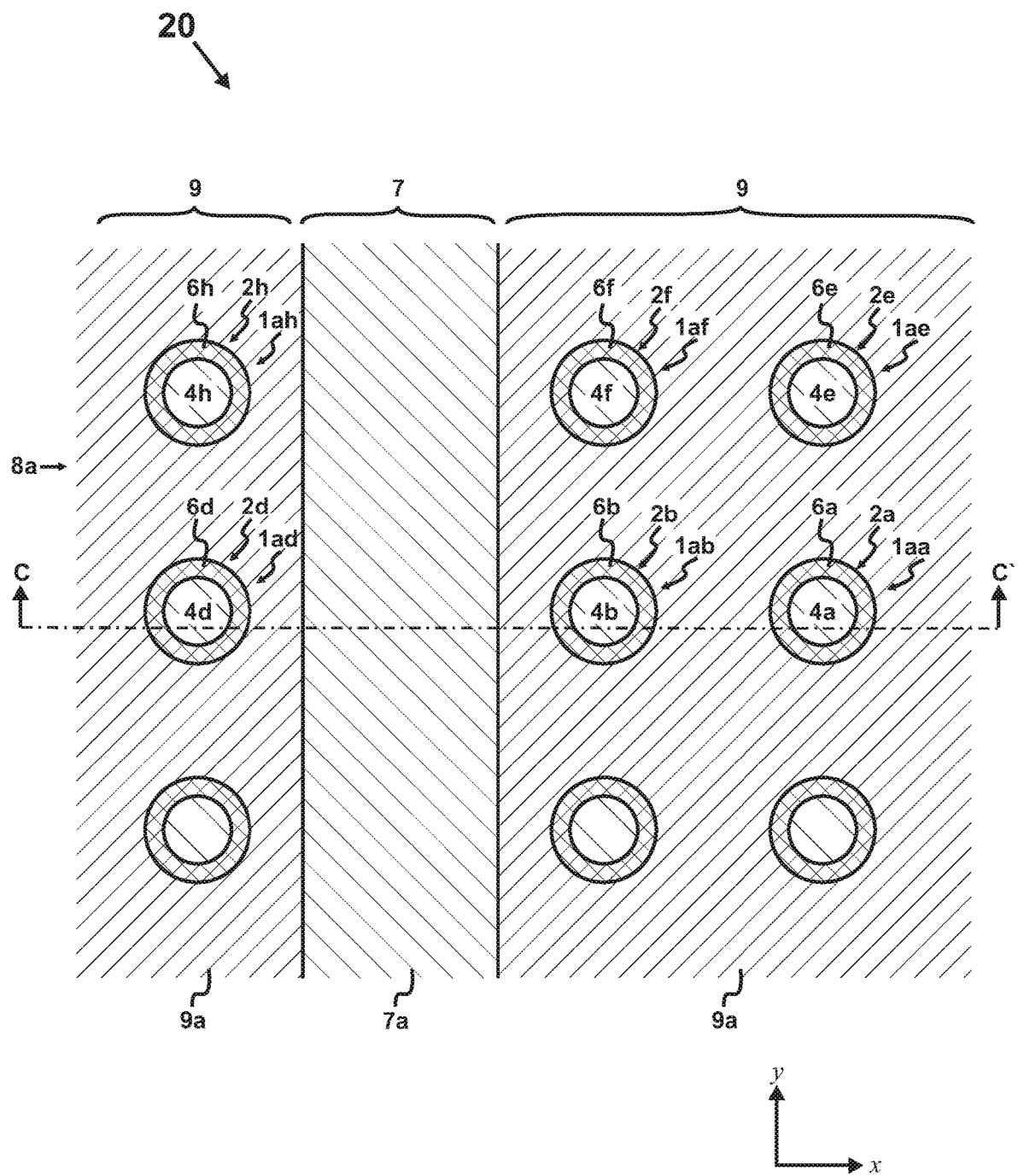
Figure 7C:
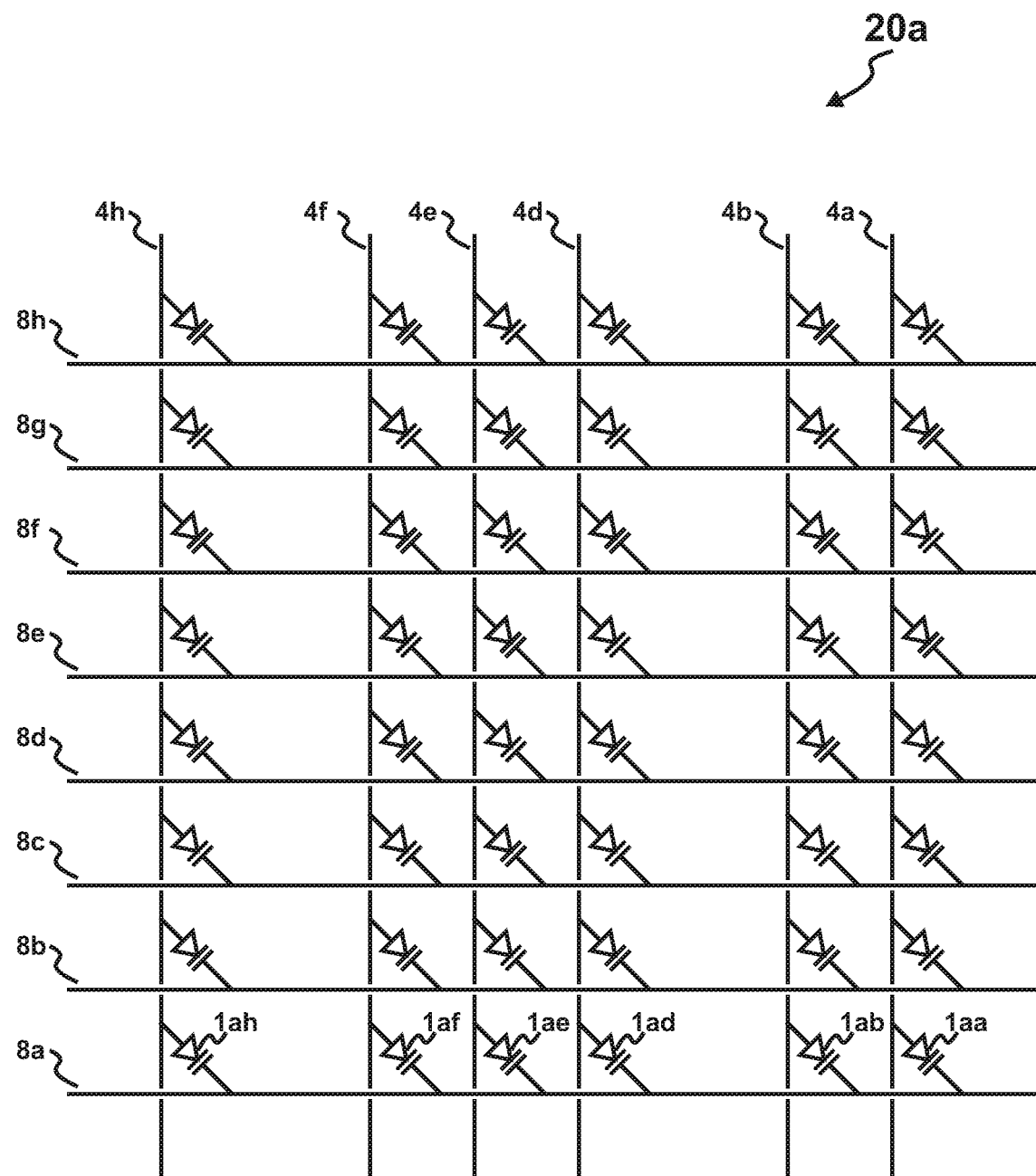
FIG. 7CA is a circuit schematic of a memory array of the second preferred shared 3D-$M_V$ which uses the memory cell of FIGS. 3AA-3AB.
Figure 7C:
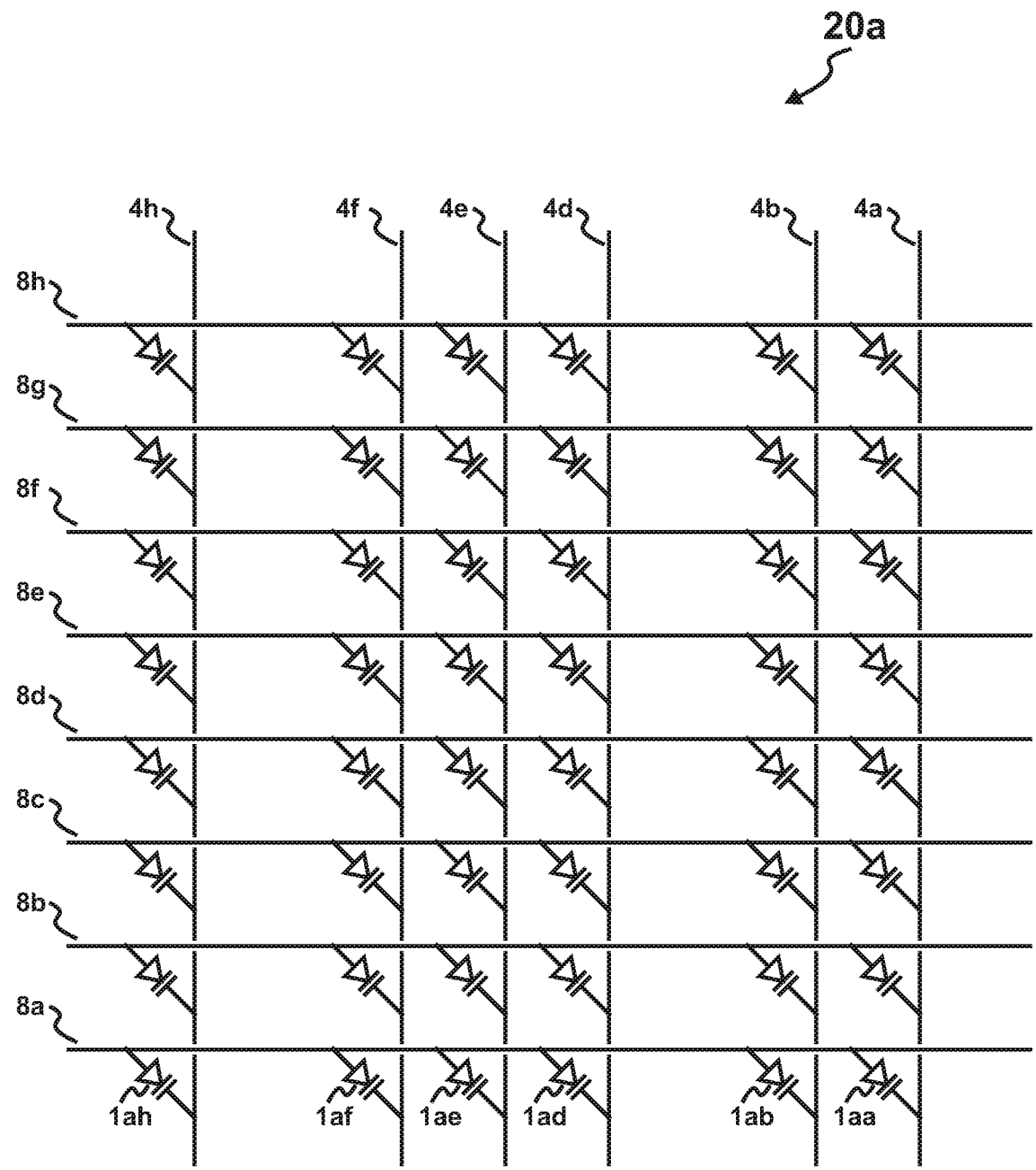

Referring now to FIGS. 7A-7CB, a second preferred shared 3D-$M_V$ 20 is disclosed. This preferred embodiment is similar to that in FIGS. 5A-5CB except that there is no memory hole in the low-resistivity section 7 (FIG. 7A). Accordingly, only the lightly-doped region 9a comprises memory cells 1aa, 1ab, 1ad-1af, 1ah, while the low-resistivity region 7a does not comprise any memory cells (FIG. 7B). This is further illustrated in FIGS. 7CA-7CB. The memory array 20a only comprises low-leakage memory cells 1aa, 1ab, 1ad-1af, 1ah (represented by open symbols), but does not comprise any high-leakage memory cells. As a result, this preferred shared 3D-$M_V$ 20 has a robust read-write performance.

Although a memory array 20a of the preferred shared 3D-$M_V$ 20 could include both low-leakage memory cells 1aa-1ha . . . and high-leakage memory cells 1ac-1hc . . . at the same time, as long as the total number of the high-leakage memory cells 1ac-1hc . . . is far smaller than the low-leakage memory cells 1aa-1ha . . . , the performance of the preferred shared 3D-$M_V$ 20 would not be compromised. Accordingly, the present invention further discloses several preferred embodiments of the shared 3D-$M_V$'s in FIGS. 8A-8D. In these figures, each dot represents a memory hole. For reason of simplicity, the internal structures of the memory hole are not shown.

Figure 8A:
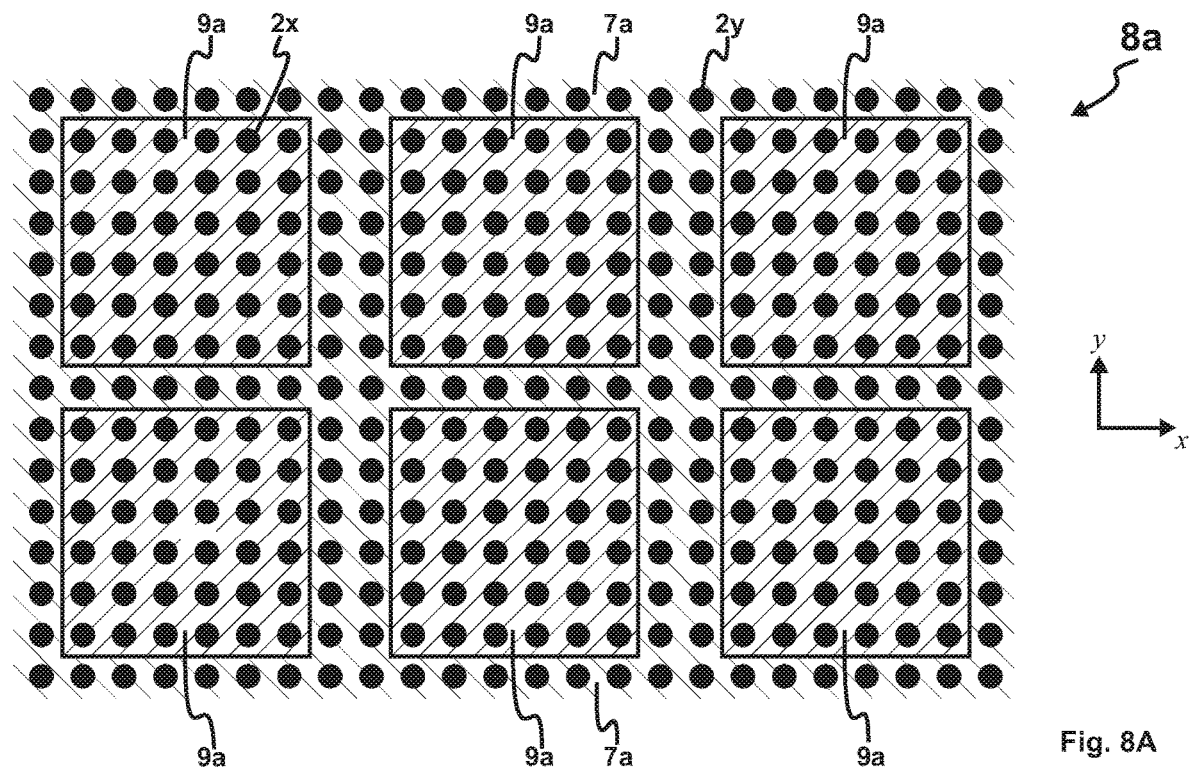
FIGS. 8A-8D are x-y top views of the horizontal address lines 8a in four preferred embodiments of the preferred shared 3D-$M_V$'s.
Figure 8B:
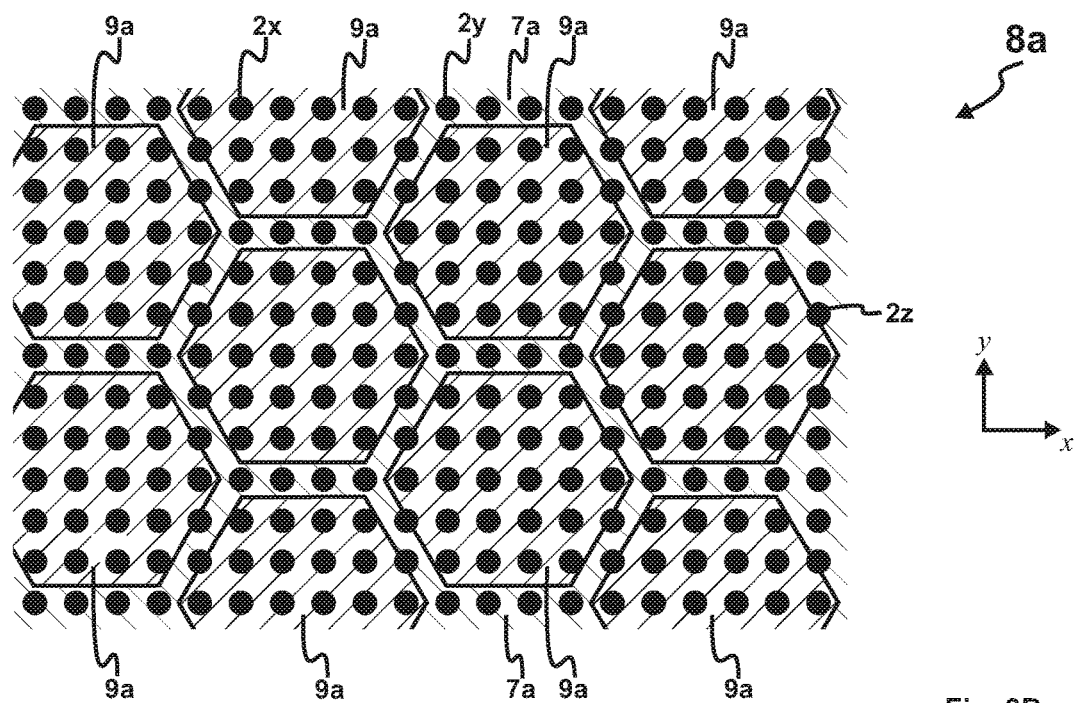

The preferred embodiment of FIG. 8A corresponds to FIGS. 5A-5CB. The low-leakage memory cells 2x are formed in the lightly-doped region 9a, while the high-leakage memory cells 2y are formed in the low-resistivity region 7a. Both low-leakage memory cells 2x and high-leakage memory cells 2y have the same areal density. As long as the total area of the lightly-doped region 9a is much larger than that of the low-resistivity region 7a, this preferred embodiment can function correctly. In FIG. 8A, the lightly-doped region 9a has a rectangular shape. Whereas, the lightly-doped region 9a in FIG. 8B has a hexagonal shape. It should be apparent to those skilled in the art that the lightly-doped region 9a could take other geometric shapes.

Figure 8C:
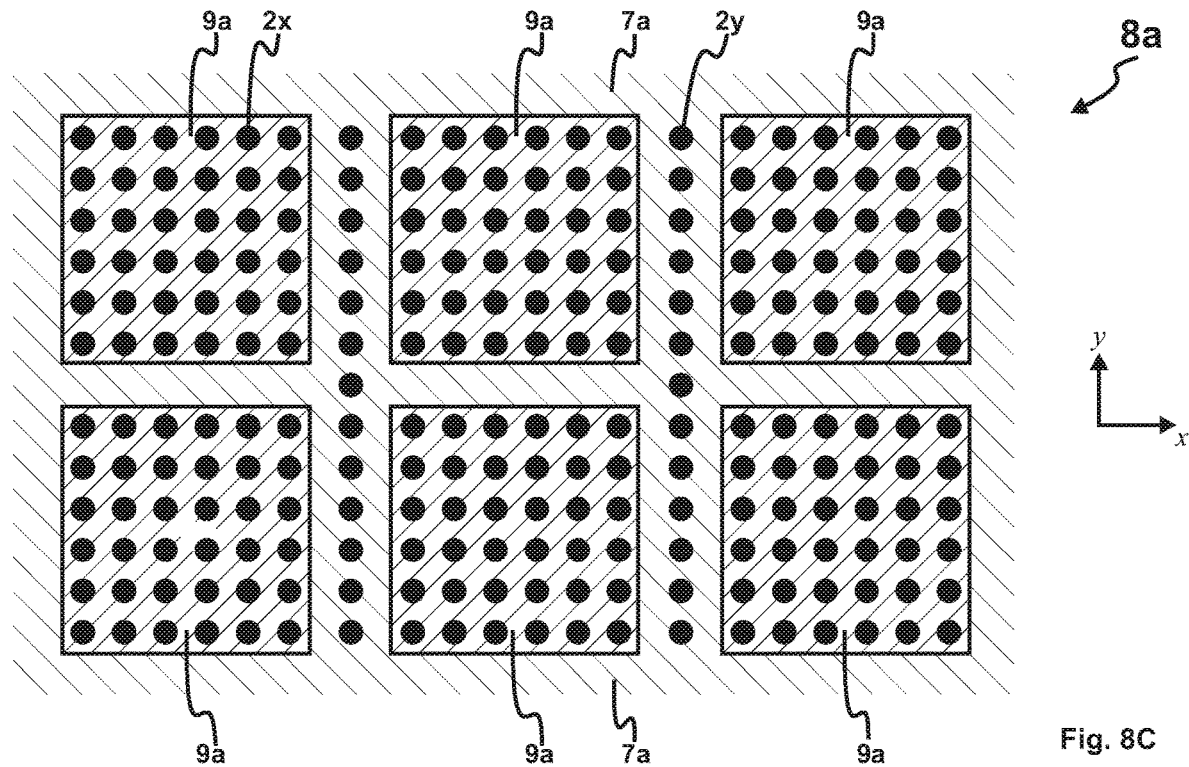
Figure 8D:
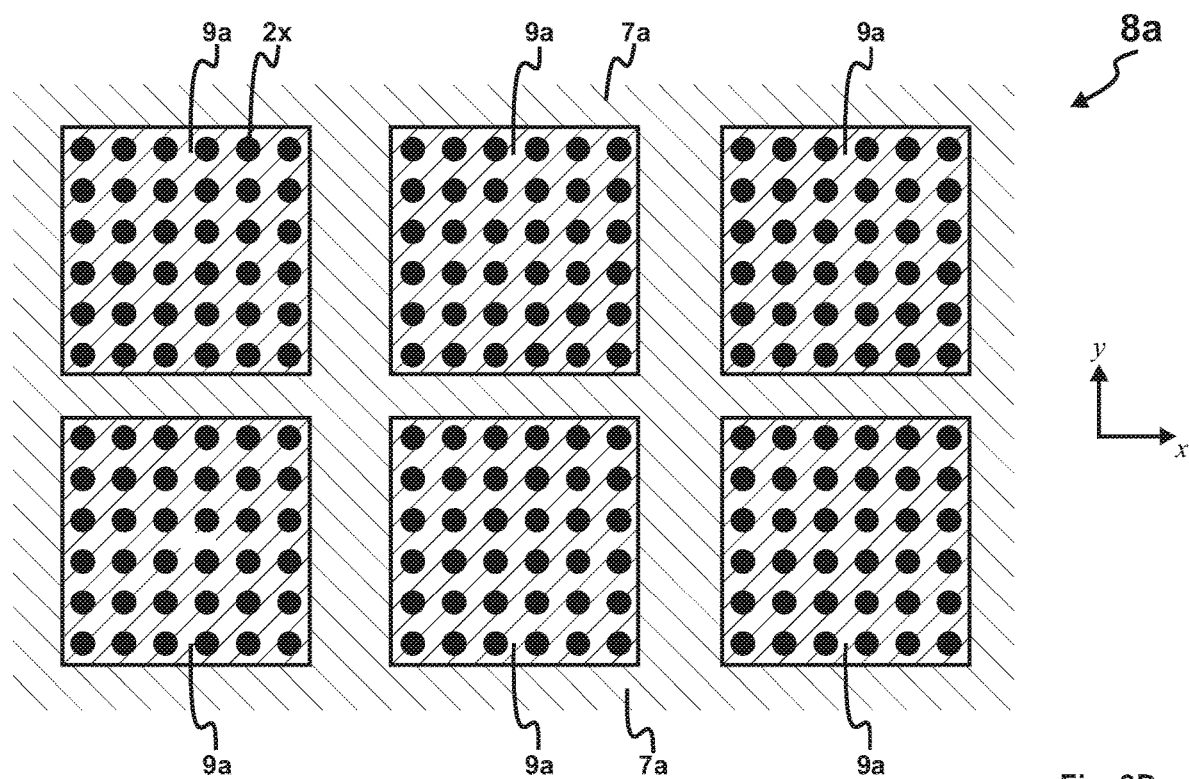

In the preferred embodiment of FIG. 8C, the areal density of the low-leakage memory cells 2x remains same as that of FIG. 8A, but the areal density of the high-leakage memory cells 2y is lower than that of FIG. 8A. Compared to FIG. 8A, it has fewer high-leakage memory cells 2y. This would improve the performance of the preferred shared 3D-$M_V$ 20. The preferred embodiment of FIG. 8D corresponds to FIGS. 7A-7CB. Because only the lightly-doped region 9a comprises memory cells while the low-resistivity region 7a does not comprise any memory cells, the memory array 20a comprises only low-leakage memory cells 2x, but no high-leakage memory cells. This would further improve the read-write performance of the preferred shared 3D-$M_V$ 20.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A three-dimensional vertical memory (3D-$M_V$), comprising:
 a semiconductor substrate including a substrate circuit;
 a plurality of horizontal address lines above said substrate circuit;
 a plurality of memory holes penetrating through said horizontal address lines;
 a plurality of programmable layers covering the sidewalls of said memory holes;
 a plurality of vertical address lines formed in said memory holes;
 each of said horizontal address lines including at least a first region and a second region outside said first region, wherein said first region comprises at least a lightly-doped semiconductor material in contact with and surrounding at least one of said programmable layers in at least one of said memory holes, and said first region has a higher resistivity than said second region.

2. The 3D-$M_V$ according to claim 1, wherein said lightly-doped semiconductor material in said first region is in contact with and surrounding selected ones of said programmable layers in at least three adjacent ones of said memory holes.

3. The 3D-$M_V$ according to claim 2, wherein the intersections of said three adjacent ones of said memory holes and said each of said horizontal address lines are neither disposed on a single straight line nor separated by said second region.

4. The 3D-$M_V$ according to claim 1, wherein the total area of said first region is larger than said second region.

5. The 3D-$M_V$ according to claim 1, wherein a plurality of memory cells formed at the intersections of said each of said horizontal address lines and said vertical address lines, with the areal density of said memory cells in said first region larger than said second region.

6. The 3D-$M_V$ according to claim 1, wherein:
said second region comprises at least a heavily-doped semiconductor material; and,
said vertical address lines comprise at least a metallic material or another heavily-doped semiconductor material with polarity opposite to said heavily-doped semiconductor material.

7. The 3D-$M_V$ according to claim 1, wherein:
said second region comprises at least a metallic material; and,
said vertical address lines comprise at least a heavily-doped semiconductor material.

8. The 3D-$M_V$ according to claim 1, wherein said programmable layer is one-time programmable, multiple-time programmable, or re-programmable.

9. A three-dimensional vertical memory (3D-$M_V$), comprising:
a semiconductor substrate including a substrate circuit;
a plurality of horizontal address lines stacked above said substrate circuit;
a plurality of memory holes penetrating through said horizontal address lines;
a plurality of programmable layers covering the sidewalls of said memory holes;
a plurality of vertical address lines formed in said memory holes;
each of said horizontal address lines including at least a first region and a second region outside said first region, wherein said first region comprises at least a lightly-doped semiconductor material surrounding at least three adjacent ones of said vertical address lines, and said first region has a higher resistivity than said second region.

10. The 3D-$M_V$ according to claim 9, wherein the intersections of said three adjacent ones of said vertical address lines and said each of said horizontal address lines are neither disposed on a single straight line nor separated by said second region.

11. The 3D-$M_V$ according to claim 9, wherein the total area of said first region is larger than said second region.

12. The 3D-$M_V$ according to claim 9, wherein a plurality of memory cells formed at the intersections of said horizontal address lines and said vertical address lines, with the areal density of said memory cells in said first region larger than said second region.

13. The 3D-$M_V$ according to claim 9, wherein:
said second region comprises at least a heavily-doped semiconductor material; and,
said vertical address lines comprise at least a metallic material or another heavily-doped semiconductor material with polarity opposite to said heavily-doped semiconductor material.

14. The 3D-$M_V$ according to claim 9, wherein:
said second region comprises at least a metallic material; and,
said vertical address lines comprise at least a heavily-doped semiconductor material.

15. The 3D-$M_V$ according to claim 9, wherein said programmable layer is one-time programmable, multiple-time programmable, or re-programmable.

16. A semiconductor memory, comprising:
a plurality of first-state memory cells including at least a first-state memory cell;
a plurality of second-state memory cells including at least a low-leakage memory cell and at least a high-leakage memory cell;
an address line coupling said first-state memory cell, said low-leakage memory cell and said high-leakage memory cell;
wherein said high-leakage memory cell has a smaller resistance than said low-leakage memory cell; and, said low-leakage memory cell has a smaller resistance than said first-state memory cell.

17. The semiconductor memory according to claim 16, further comprising:
a semiconductor substrate including a substrate circuit;
a plurality of horizontal address lines stacked above said substrate circuit;
a plurality of memory holes penetrating through said horizontal address lines;
a plurality of programmable layers covering the sidewalls of said memory holes;
a plurality of vertical address lines formed in said memory holes;
wherein each of said horizontal address lines comprises at least first and second regions, with said first region having a higher resistivity than said second region;
wherein said low-leakage memory cell is formed at an intersection of said first region and a selected one of said vertical address lines; and, said high-leakage memory cell is formed at another intersection of said second region and another selected one of said vertical address lines.

18. The semiconductor memory according to claim 16, wherein said first region comprises at least a lightly-doped semiconductor material; and, said second region comprises at least a heavily-doped semiconductor material or a metallic material.

19. The semiconductor memory according to claim 16, wherein the total area of said first region is larger than said second region.

20. The semiconductor memory according to claim 16, wherein said semiconductor memory is one-time programmable, multiple-time programmable, or re-programmable.

* * * * *